US012592266B2

(12) United States Patent
Lee et al.

(10) Patent No.: US 12,592,266 B2
(45) Date of Patent: Mar. 31, 2026

(54) MEMORY DEVICE INCLUDING VOLTAGE GENERATING CIRCUIT AND OPERATION METHOD OF MEMORY DEVICE

(71) Applicant: SAMSUNG ELECTRONICS CO., LTD., Suwon-si (KR)

(72) Inventors: Yoonjae Lee, Suwon-si (KR); Yeji Shin, Suwon-si (KR); Sang-Wan Nam, Suwon-si (KR); Sang-Won Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 140 days.

(21) Appl. No.: 18/418,001

(22) Filed: Jan. 19, 2024

(65) Prior Publication Data

US 2025/0087256 A1      Mar. 13, 2025

(30) Foreign Application Priority Data

Sep. 7, 2023    (KR) ........................ 10-2023-0118965
Nov. 27, 2023    (KR) ........................ 10-2023-0167068

(51) Int. Cl.
G11C 11/30 (2006.01)
G11C 7/10 (2006.01)

(52) U.S. Cl.
CPC .......... G11C 7/1096 (2013.01); G11C 7/1069 (2013.01); G11C 7/1084 (2013.01)

(58) Field of Classification Search
CPC .................................................... G11C 16/30
See application file for complete search history.

(56) References Cited

U.S. PATENT DOCUMENTS

| 10,693,369 B2 | 6/2020 | Ku et al. | |
| 11,302,397 B2 | 4/2022 | Yip | |
| 2009/0278591 A1* | 11/2009 | Pyeon | G11C 16/30 |
| | | | 327/536 |
| 2022/0165339 A1* | 5/2022 | Rana | G11C 29/12005 |
| 2022/0238167 A1 | 7/2022 | Suzuki et al. | |
| 2022/0359004 A1 | 11/2022 | Won et al. | |

FOREIGN PATENT DOCUMENTS

| CN | 103872904 | 8/2016 |
| CN | 104091613 | 2/2017 |
| CN | 111402943 | 7/2020 |
| KR | 10-1310075 | 9/2013 |
| KR | 10-2022-0151748 | 11/2022 |

* cited by examiner

*Primary Examiner* — Hoai V Ho
(74) *Attorney, Agent, or Firm* — Fish & Richardson P.C.

(57) ABSTRACT

Disclosed is a memory device which includes a memory cell array that includes a plurality of memory cells, and a peripheral circuit configured to perform a plurality of operations on the memory cell array by using a plurality of operating voltages. The peripheral circuit includes a voltage generating circuit including a first pump block, a second pump block, and a common pump block. The voltage generating circuit connects the first pump block and the common pump block in parallel to generate a first operating voltage among the plurality of operating voltages and connects the common pump block and the second pump block in series to generate a second operating voltage among the plurality of operating voltages. The common pump block is configurable to match the first pump block, the second pump block, or both, as needed.

20 Claims, 18 Drawing Sheets

[Read Operation]

[Program Operation / Erase Operation]

Figure 6:
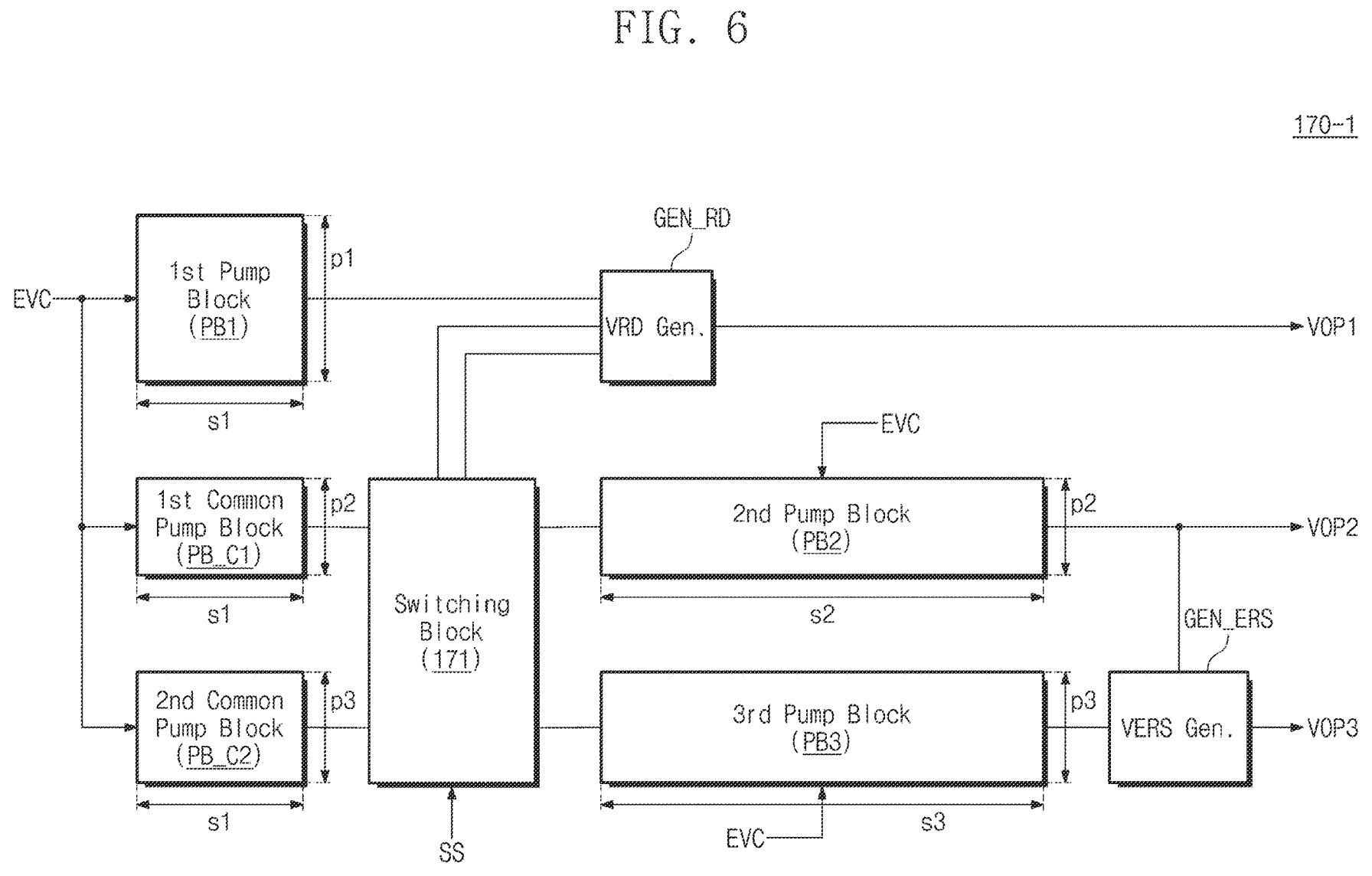

VOP1

VOP2

VOP3

GEN_ERS

GEN_RD

EVC

VRD Gen.

VERS Gen.

2nd Pump Block (PB2)

3rd Pump Block (PB3)

p2 p3 s2 s3

EVC

Switching Block (171)

SS

1st Pump Block (PB1)

1st Common Pump Block (PB_C1)

2nd Common Pump Block (PB_C2)

p1 p2 p3 s1 s1 s1

EVC

Figure 8:
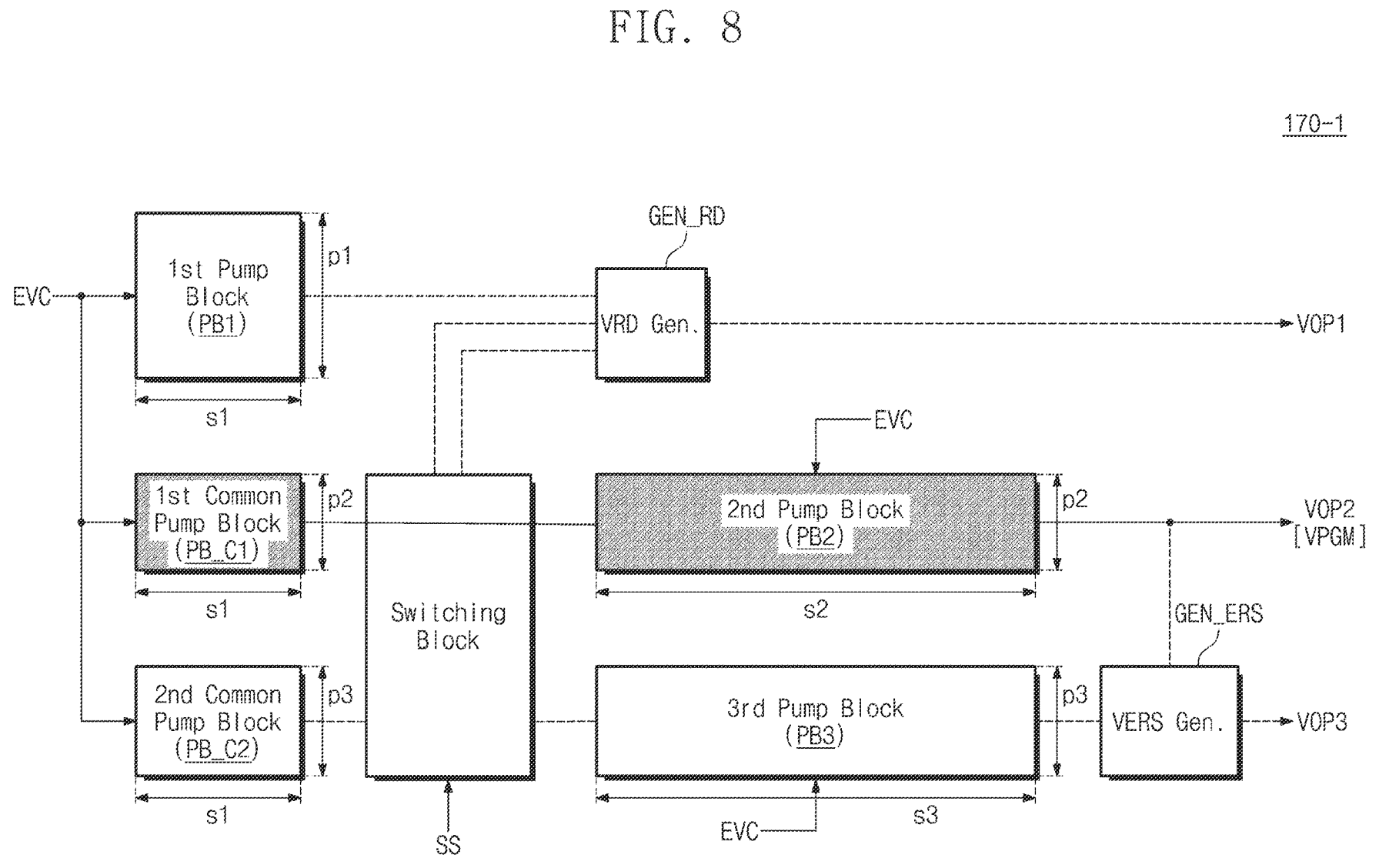

VOP1

GEN_RD

VRD Gen.

1st Pump Block (PB1)

p1 s1

EVC

VOP2 [VPGM]

EVC

2nd Pump Block (PB2)

p2 s2

1st Common Pump Block (PB_C1)

p2 s1

GEN_ERS

VERS Gen.

VOP3

3rd Pump Block (PB3)

p3 s3

EVC

2nd Common Pump Block (PB_C2)

p3 s1

Switching Block

SS

EVC

Figure 9:
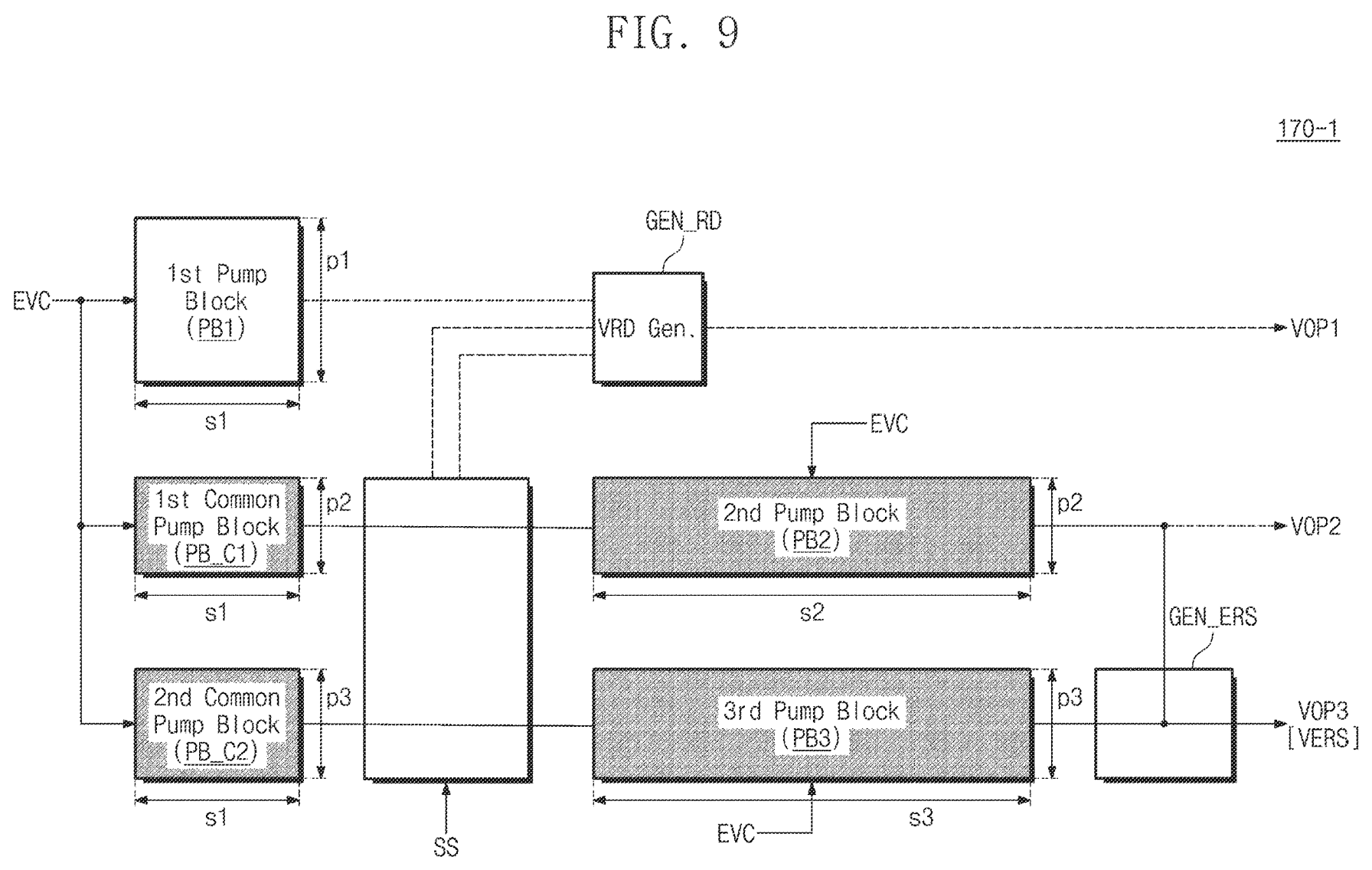

VRD Gen. (GEN_RD)

1st Pump Block (PB1) — p1, s1

1st Common Pump Block (PB_C1) — p2, s1

2nd Common Pump Block (PB_C2) — p3, s1

2nd Pump Block (PB2) — p2, s2

3rd Pump Block (PB3) — p3, s3

EVC

SS

GEN_ERS

VOP1

VOP2

VOP3 [VERS]

GEN1

171

PB1 [s1/p1]

PB2 [s2/p2]

PB3 [s3/p3]

PB_Cb [s3/pb]

PB_C

VOP1-2

PB4 [s4/p4]

PB5 [s5/p5]

PB6 [s6/p6]

GEN2

VOP2

: Activated Unit Pump

GEN1

VOP1

171

PB1 [s1/p1]

PB2 [s2/p2]

PB3 [s3/p3]

PB_C

PB_Cc [sc/p4]

GEN2

VOP2-1

PB4 [s4/p4]

PB5 [s5/p5]

PB6 [s6/p6]

: Activated Unit Pump

Figure 14:
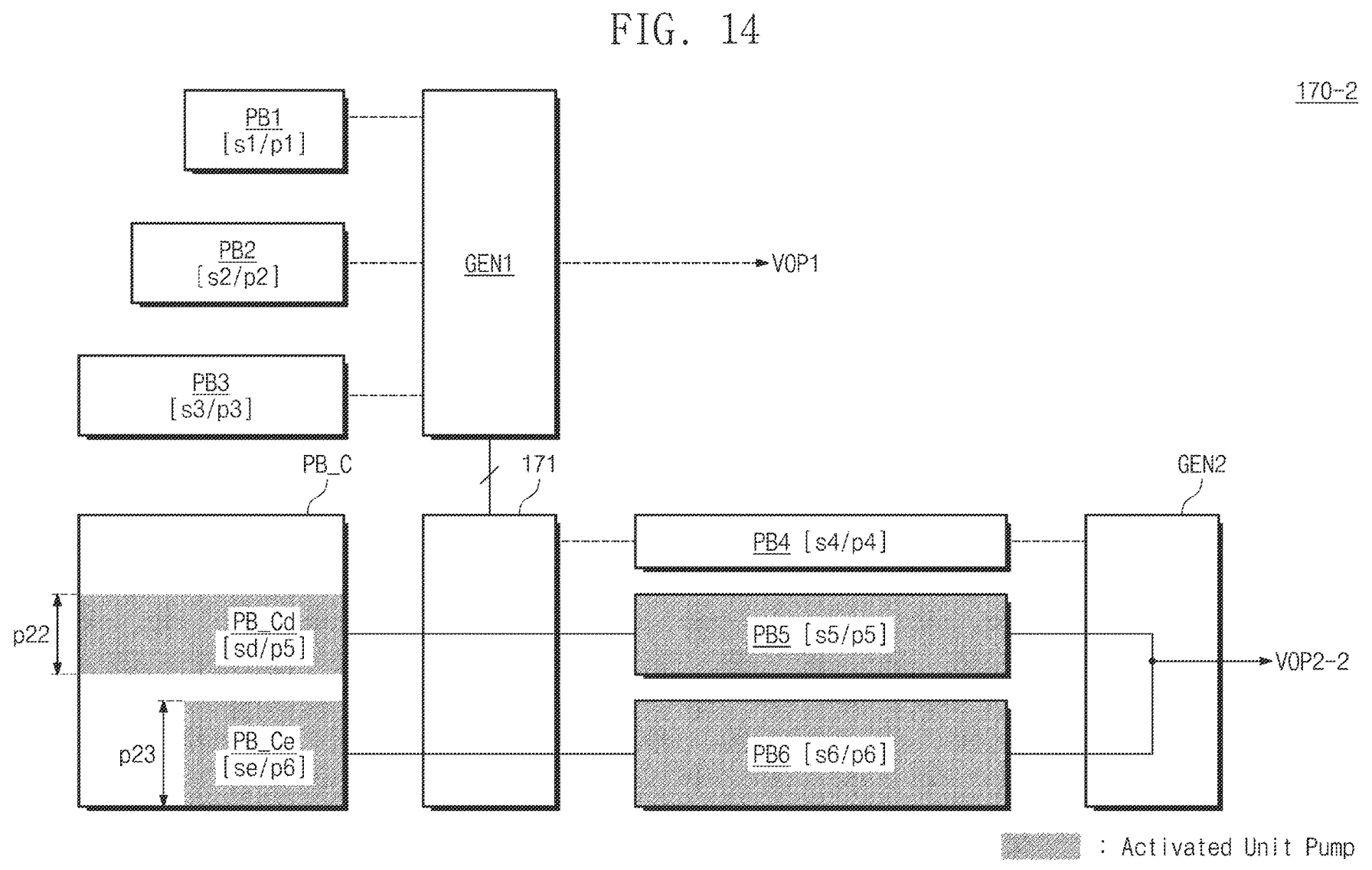

GEN1

VOP1

PB1 [s1/p1]

PB2 [s2/p2]

PB3 [s3/p3]

171

PB_C

PB_Cd [sd/p5]

PB_Ce [se/p6]

p22 p23

GEN2

VOP2-2

PB4 [s4/p4]

PB5 [s5/p5]

PB6 [s6/p6]

: Activated Unit Pump

MEMORY DEVICE INCLUDING VOLTAGE GENERATING CIRCUIT AND OPERATION METHOD OF MEMORY DEVICE

CROSS-REFERENCE TO RELATED APPLICATIONS

This application claims priority under 35 U.S.C. § 119 to Korean Patent Application Nos. 10-2023-0118965 filed on Sep. 7, 2023, and 10-2023-0167068 filed on Nov. 27, 2023, in the Korean Intellectual Property Office, the disclosures of which are incorporated by reference herein in their entireties.

BACKGROUND

A semiconductor memory is classified as a volatile memory, which loses data stored therein when a power is turned off, such as a static random access memory (SRAM) or a dynamic random access memory (DRAM) or a nonvolatile memory, which retains data stored therein even when a power is turned off, such as a flash memory, a phase-change RAM (PRAM), a magnetic RAM (MRAM), a resistive RAM (RRAM), or a ferroelectric RAM (FRAM). The flash memory device operates by using various operating voltages. The flash memory device generates various operating voltages by using a voltage generating circuit. In this case, because various operating voltages (e.g., a read voltage, a program voltage, and an erase voltage) have various levels or correspond to various sizes of loads, the voltage generating circuit generates operating voltages by using a voltage pump or a charge pump which is appropriate for a characteristic of each operating voltage. However, when the voltage pump is used for each of the characteristics of the operating voltages, the area (or size) of the voltage generating circuit increases.

SUMMARY

The present disclosure describes a memory device including a voltage generating circuit with reduced costs and improved performance and an operation method of the memory device.

A memory device includes a memory cell array that includes a plurality of memory cells, and a peripheral circuit configured to perform a plurality of operations on the memory cell array by using a plurality of operating voltages. The peripheral circuit includes a voltage generating circuit including a first pump block, a second pump block, and a first common pump block and generating the plurality of operating voltages. The voltage generating circuit connects the first pump block and the first common pump block in parallel to generate a first operating voltage among the plurality of operating voltages and connects the first common pump block and the second pump block in series to generate a second operating voltage among the plurality of operating voltages.

A memory device includes a memory cell array that includes a plurality of memory cells, a control logic circuit that generates a switching signal in response to a command received from an external device, and a voltage generating circuit that includes a first pump block, a second pump block, and a first common pump block. In response to the switching signal, the voltage generating circuit generates a first operating voltage by using the first pump block and the first common pump block and generates a second operating voltage by using the second pump block and the first common pump block.

An operation method of a memory device includes receiving an operation command from an external device, performing a read operation based on a read voltage when the operation command is a read command, and performing a program operation based on a program voltage when the operation command is a program command. The memory device connects a first pump block, a first common pump block, and a second common pump block in parallel to generate the read voltage and connects the first common pump block and a second pump block in series to generate the program voltage.

BRIEF DESCRIPTION OF THE FIGURES

The above and other objects and features of the present disclosure will become apparent by describing in detail embodiments thereof with reference to the accompanying drawings.

FIG. 6 is a block diagram illustrating an example voltage generating circuit of FIG. 1.

FIGS. 7 to 9 are diagrams for describing an example operation of a voltage generating circuit of FIG. 6.

FIGS. 11 to 15 are diagrams for describing example operations of the voltage generating circuit of FIG. 10.

DETAILED DESCRIPTION

Below, embodiments of the present disclosure will be described in detail and clearly to such an extent that an ordinary one in the art easily carries out the present disclosure.

Figure 1:
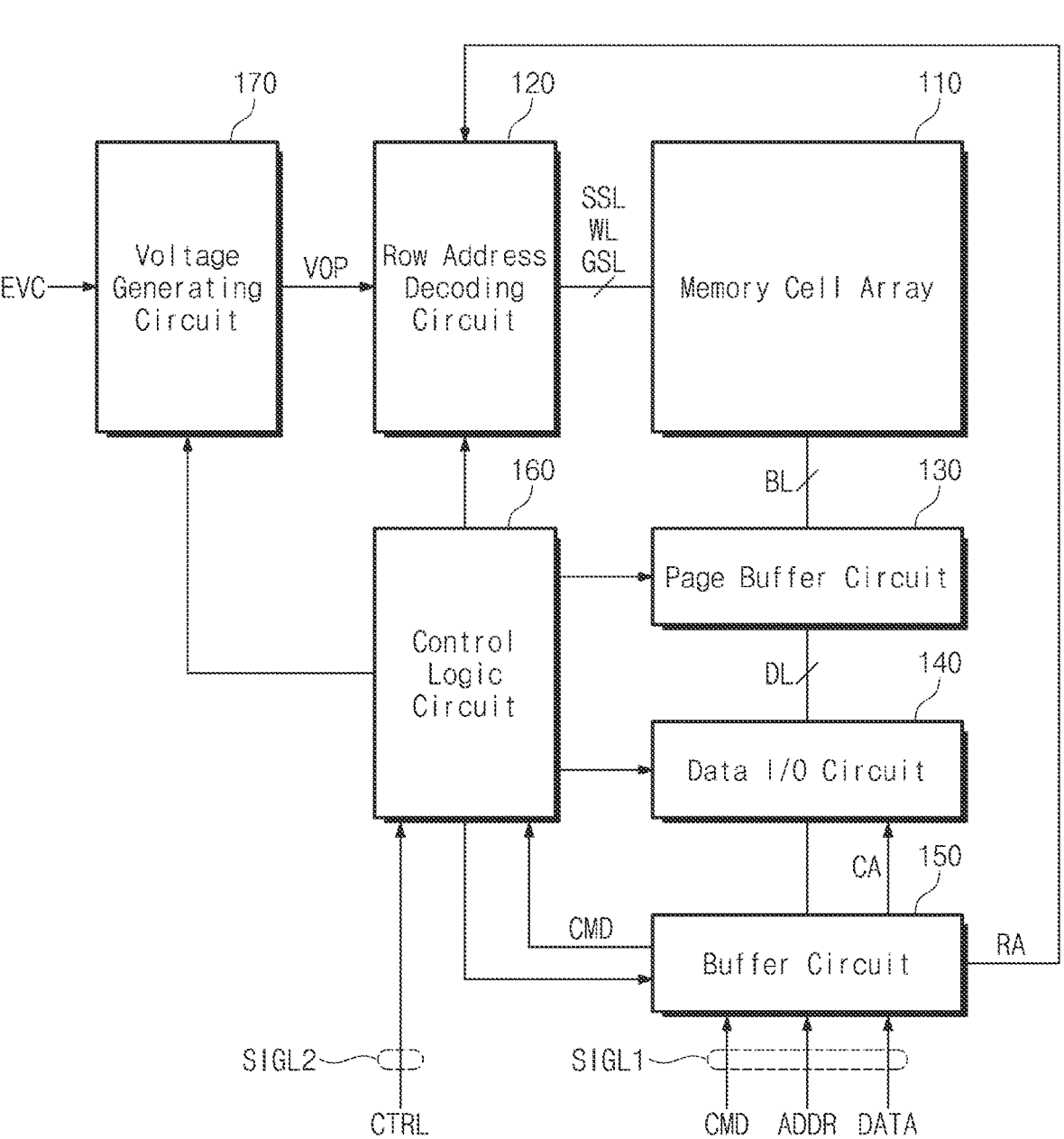
FIG. 1 is a block diagram illustrating an example memory device.

FIG. 1 is a block diagram illustrating an example memory device. A memory device 100 may be a nonvolatile memory device including a NAND flash memory. However, the present disclosure is not limited thereto. Referring to FIG. 1, the memory device 100 may include a memory cell array 110, a row address decoding circuit (or a row decoding circuit) 120, a page buffer circuit 130, a data input/output circuit 140, a buffer circuit 150, a control logic circuit 160, and a voltage generating circuit 170.

The memory cell array 110 may include a plurality of memory blocks. Each of the plurality of memory blocks includes a plurality of memory cells. Each of the plurality of the memory blocks may be connected to the row decoding circuit 120 through at least one ground selection line GSL, word lines WL, and at least one string selection line SSL.

The plurality of memory blocks may be connected in common to a plurality of bit lines BL. The plurality of memory blocks may be connected to the page buffer circuit 130 through the plurality of bit lines BL. In an implementation, each of the plurality of memory cells may operate as a single level cell (SLC), a multi-level cell (MLC), a triple level cell (TLC), a quad level cell (QLC), a penta level cell (PLC), etc. depending on the way to operate.

In an implementation, each of the plurality of memory blocks may be a unit of the erase operation. Memory cells included in the same memory block among the plurality of memory blocks may be erased at the same time. In an implementation, each of the plurality of memory blocks may be divided into sub-blocks. Each of the plurality of sub-blocks may correspond to a unit of the erase operation. Memory cells included in the same sub-block among the plurality of sub-blocks may be erased at the same time.

The row decoding circuit 120 may be connected to the memory cell array 110 through the string selection lines SSL, the word lines WL, and the ground selection lines GSL. The row decoding circuit 120 may operate under control of the control logic circuit 160. For example, under control of the control logic circuit 160, the row decoding circuit 120 may decode a row address RA received from the buffer circuit 150; based on a decoding result, the row decoding circuit 120 may control or drive the string selection lines SSL, the word lines WL, and the ground selection lines GSL or may control voltages applied to the string selection lines SSL, the word lines WL, and the ground selection lines GSL.

The page buffer circuit 130 may be connected to the memory cell array 110 through the plurality of bit lines BL. The page buffer circuit 130 may be connected to the data input/output circuit 140 through a plurality of data lines DL. The page buffer circuit 130 may operate under control of the control logic circuit 160. For example, in the program operation of the memory device 100, the page buffer circuit 130 may store data to be programmed in the memory cell array 110 under control of the control logic circuit 160. In the read operation of the memory device 100, the page buffer circuit 130 may sense voltages of the plurality of bit lines BL and may store the sensed voltages as read data.

The data input/output circuit 140 may be connected to the page buffer circuit 130 through the plurality of data lines DL. The data input/output circuit 140 may receive a column address CA from the buffer circuit 150. The data input/output circuit 140 may transfer the read data read by the page buffer circuit 130 to the buffer circuit 150 depending on the column address CA. The data input/output circuit 140 may transfer data received from the buffer circuit 150 to the page buffer circuit 130 based on the column address CA.

The buffer circuit 150 may receive a command CMD and an address ADDR through first signal lines SIGL1 and may exchange data "DATA" with an external device (e.g., a controller) through the first signal lines SIGL1. In an implementation, the first signal lines SIGL1 may be data signal lines (e.g., DQ lines).

The buffer circuit 150 may operate under control of the control logic circuit 160. The buffer circuit 150 may transfer the command CMD to the control logic circuit 160. The buffer circuit 150 may transfer the row address RA of the address ADDR to the row decoding circuit 120 and may transfer the column address CA of the address ADDR to the data input/output circuit 140. The buffer circuit 150 may exchange the data "DATA" with the data input/output circuit 140.

The control logic circuit 160 may exchange a control signal CTRL with the external device (e.g., a controller)

through second signal lines SIGL2. The control logic circuit 160 may control the buffer circuit 150 based on the control signals CTRL such that the buffer circuit 150 routes the command CMD, the address ADDR, and the data "DATA". The control logic circuit 160 may decode the command CMD received from the buffer circuit 150 and may control the memory device 100 or various components of the memory device 100 based on a decoding result.

Under control of the control logic circuit 160, the voltage generating circuit 170 may generate various operating voltages VOP which are used in the memory device 100. For example, in the program operation of the memory device 100, the voltage generating circuit 170 may generate a program voltage to be provided to a selected word line among the plurality of word lines WL. In the read operation of the memory device 100, the voltage generating circuit 170 may generate a read voltage to be provided to a selected word line among the plurality of word lines WL. In the erase operation of the memory device 100, the voltage generating circuit 170 may generate an erase voltage to be provided to a substrate or a common source line of the memory device 100. Various operating voltages (e.g., the program voltage, the read voltage, and the erase voltage) described above are provided as an example, and various operating voltages which the memory device 100 uses may further include various voltages such as non-selection read voltages, pass voltages, and verify voltages.

In an implementation, the voltage generating circuit 170 may generate various operating voltages VOP by using an external voltage EVC. For example, the voltage generating circuit 170 may include a plurality of voltage pumps (or charge pumps). Each of the plurality of voltage pumps may generate various voltage levels by using the external voltage EVC. The voltage generating circuit 170 may generate various operating voltages VOP by using a plurality of voltage pumps.

In an implementation, the remaining components (e.g., the row decoding circuit 120, the page buffer circuit 130, the data input/output circuit 140, the buffer circuit 150, the control logic circuit 160, and the voltage generating circuit 170) other than the memory cell array 110 may constitute a peripheral circuit, and the peripheral circuit may perform various operations (e.g., the read operation, the program operation, or the erase operation) of the memory device 100 or the memory cell array 110 by using various operating voltages generated by the voltage generating circuit 170.

Figure 2:
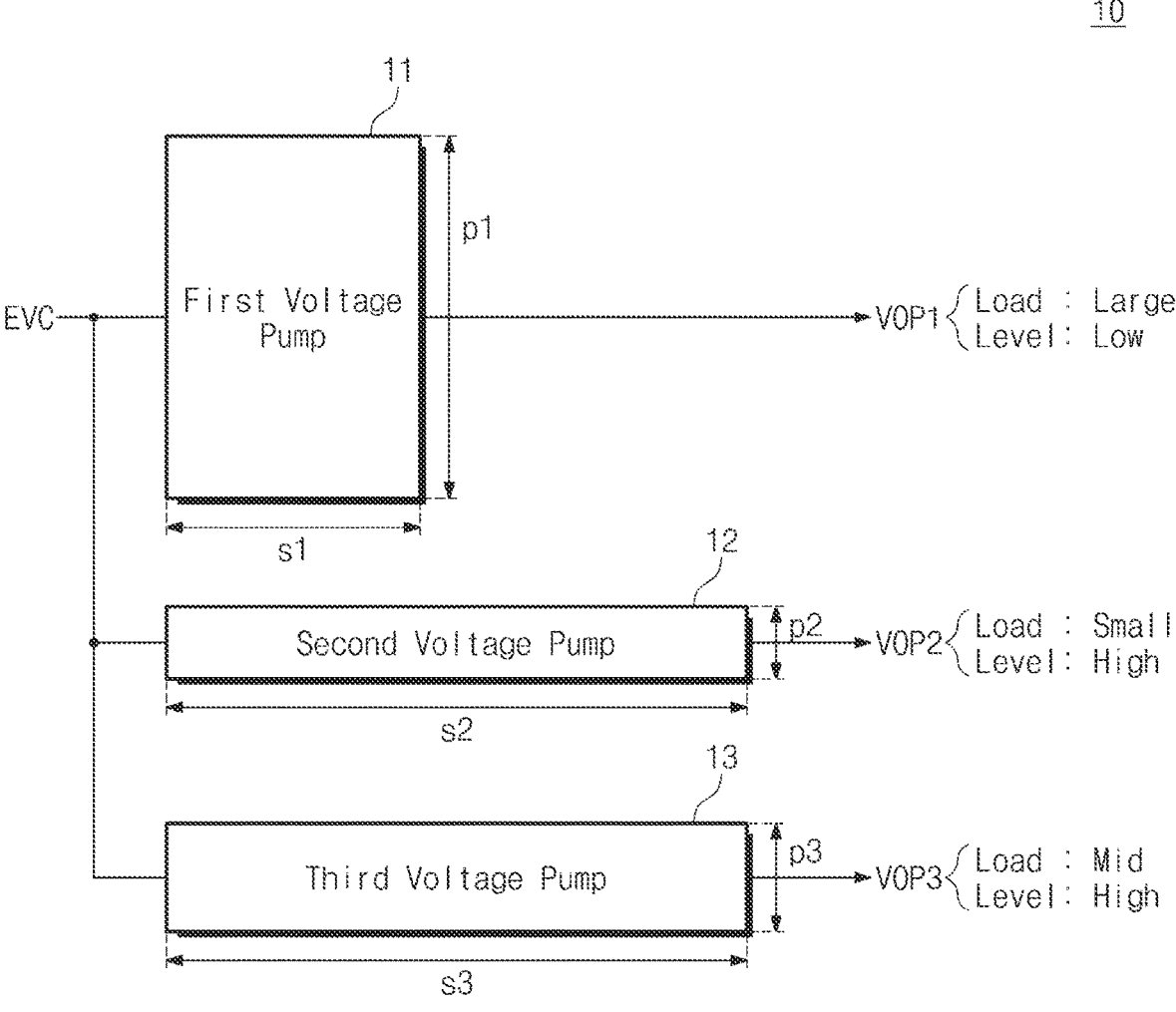
FIG. 2 is a diagram illustrating an example voltage generating circuit.

FIG. 2 is a diagram illustrating an example voltage generating circuit. For convenience of description, it is assumed that a voltage generating circuit 10 of FIG. 2 generates first to third operating voltages VOP1, VOP2, and VOP3 used in the memory device 100. However, the present disclosure is not limited thereto, and the voltage generating circuit 10 may generate various other operating voltages.

Referring to FIG. 2, the voltage generating circuit 10 may include a plurality of voltage pumps 11 to 13. The plurality of voltage pumps 11 to 13 may respectively generate the plurality of operating voltages VOP1 to VOP3. For example, the first voltage pump 11 may generate the first operating voltage VOP1 by using the external voltage EVC. The second voltage pump 12 may generate the second operating voltage VOP2 by using the external voltage EVC. The third voltage pump 13 may generate the third operating voltage VOP3 by using the external voltage EVC.

In an implementation, the first to third voltage pumps 11 to 13 may have different structures depending on characteristics of the corresponding operating voltages VOP1, VOP2, and VOP3. For example, each of the plurality of voltage pumps 11 to 13 may include a plurality of unit pumps. The unit pumps of the first voltage pump 11 may be connected depending on a first serial size s1 and a first parallel size p1. The unit pumps of the second voltage pump 12 may be connected depending on a second serial size s2 and a second parallel size p2. The unit pumps of the third voltage pump 13 may be connected depending on a third serial size s3 and a third parallel size p3. In an implementation, in each voltage pump, the serial size s1, s2, or s3 may indicate the number of voltage pumps connected in series, and the parallel size p1, p2, or p3 may indicate the number of voltage pumps connected in parallel. That is, the unit pumps included in the first voltage pump 11 may be connected in series as much as s1, and the unit pumps connected in series as much as s1 may be connected in parallel as much as p1.

Below, for convenience of description, unit pumps connected in series are referred to as a "stage". That is, the first voltage pump 11 may include "p1" stages connected in parallel, and each stage may include "s1" unit pumps connected in series. The second voltage pump 12 may include "p2" stages connected in parallel, and each stage may include "s2" unit pumps connected in series. The third voltage pump 13 may include "p3" stages connected in parallel, and each stage may include "s3" unit pumps connected in series.

The above descriptions are provided as an example to describe implementations of the present disclosure, and the present disclosure is not limited thereto. For example, the parallel size such as p1, p2, or p3 may not be limited to the number of stages connected in parallel and may indicate the size of unit pumps included in stages. That is, that the parallel size is large may indicate that the size of unit pumps included in a stage is large. As an example, the case where the size of the unit pump is large may be appropriate for a larger load.

The operating voltages VOP1 to VOP3 respectively generated from the plurality of voltage pumps 11 to 13 may have different characteristics. For example, the levels of the operating voltages VOP1, VOP2, and VOP3 may be different from each other, or load sizes respectively corresponding to the operating voltages VOP1, VOP2, and VOP3 may be different from each other. For example, a target level of the first operating voltage VOP1 may be relatively low, and the load corresponding to the first operating voltage VOP1 may be large. The second operating voltage VOP2 may be relatively high, and the load corresponding to the second operating voltage VOP2 may be relatively small. The third operating voltage VOP3 may be relatively high, and the load corresponding to the third operating voltage VOP3 may be mid.

In this case, the number (i.e., p1) of parallel-connected stages included in the first voltage pump 11 may be relatively great, and the number (i.e., s1) of serial-connected unit pumps included in each stage of the first voltage pump 11 may be relatively small. The number (i.e., p2) of parallel-connected stages included in the second voltage pump 12 may be relatively small, and the number (i.e., s2) of serial-connected unit pumps included in each stage of the second voltage pump 12 may be relatively great. The number (i.e., p3) of parallel-connected stages included in the third voltage pump 13 may be relatively small, and the number (i.e., s3) of serial-connected unit pumps included in each stage of the third voltage pump 13 may be relatively great.

In other words, as the number of serial-connected unit pumps included in one stage increases, an operating voltage whose level is relatively high may be generated, and as the number of parallel-connected stages increases, an operating voltage which is appropriate for a relatively large load may be generated.

As described above, because the structure of the voltage pump is variously varied depending on characteristics (i.e., a target level and a load state) of operating voltages, various structures of voltage pumps are required to generate various operating voltages which the memory device 100 requires. In this case, the area of the voltage generating circuit 10 may increase.

Figure 3:
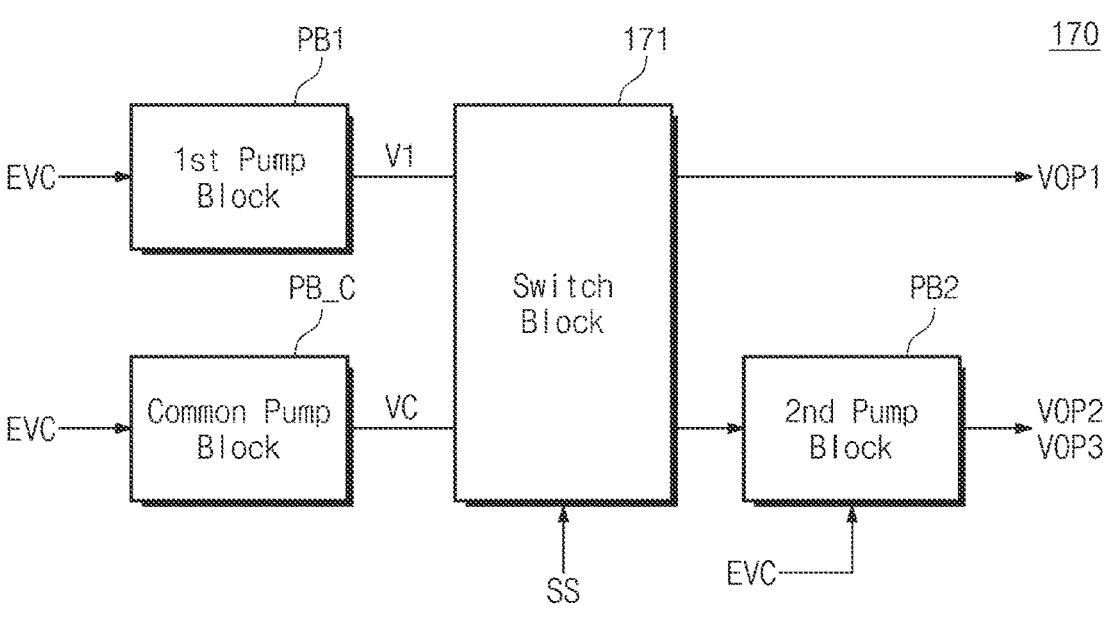
FIG. 3 is a diagram illustrating an example voltage generating circuit of FIG. 1.

FIG. 3 is a diagram illustrating an example voltage generating circuit of FIG. 1. Referring to FIGS. 1 and 3, the voltage generating circuit 170 may include a first pump block PB1, a second pump block PB2, a common pump block PB_C, and a switch block 171.

The first pump block PB1, the second pump block PB2, and the common pump block PB_C may operate by using the external voltage EVC. For example, each of the first pump block PB1, the second pump block PB2, and the common pump block PB_C may generate an output voltage by using the external voltage EVC.

The switch block 171 may control the connection relationship between the first pump block PB1, the second pump block PB2, and the common pump block PB_C in response to a switching signal SS. For example, the control logic circuit 160 may provide the switching signal SS to the voltage generating circuit 170 depending on the operation of the memory device 100. When the first operating voltage VOP1 is required in the operation of the memory device 100, in response to the switching signal SS, the switch block 171 may output the first operating voltage VOP1 based on an output V1 of the first pump block PB1 and an output VC of the common pump block PB_C. Alternatively, when the second operating voltage VOP2 or the third operating voltage VOP3 is required in the operation of the memory device 100, in response to the switching signal SS, the switch block 171 may provide the output VC of the common pump block PB_C to the second pump block PB2. In this case, the second pump block PB2 may generate the second operating voltage VOP2 or the third operating voltage VOP3 by using the output VC of the common pump block PB_C and the external voltage EVC.

In an implementation, when the first operating voltage VOP1 is generated, the first pump block PB1 and the common pump block PB_C may be connected in parallel by the switch block 171, and the second pump block PB2 may not be used. When the second operating voltage VOP2 or the third operating voltage VOP3 is generated, the common pump block PB_C and the second pump block PB2 may be connected in series by the switch block 171, and the first pump block PB1 may not be used. That is, because the common pump block PB_C is used in common or is shared to generate the first to third operating voltages VOP1 to VOP3, the whole area of the voltage generating circuit 170 may be reduced. The decrease in the area of the voltage generating circuit 170 may make it possible to add any other components (e.g., memory cells or any other peripheral circuits). This may mean that the bit density of the memory device 100 is improved.

Figure 4:
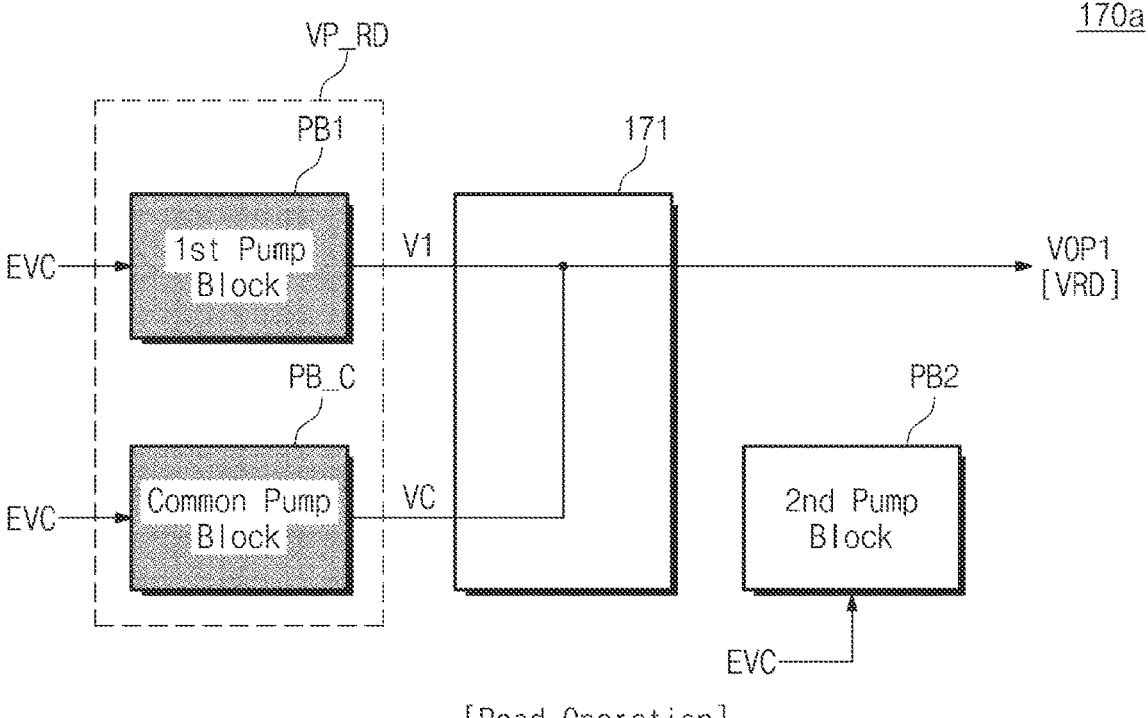
FIGS. 4 and 5 are diagrams for describing an example operation of a voltage generating circuit of FIG. 3.
Figure 5:
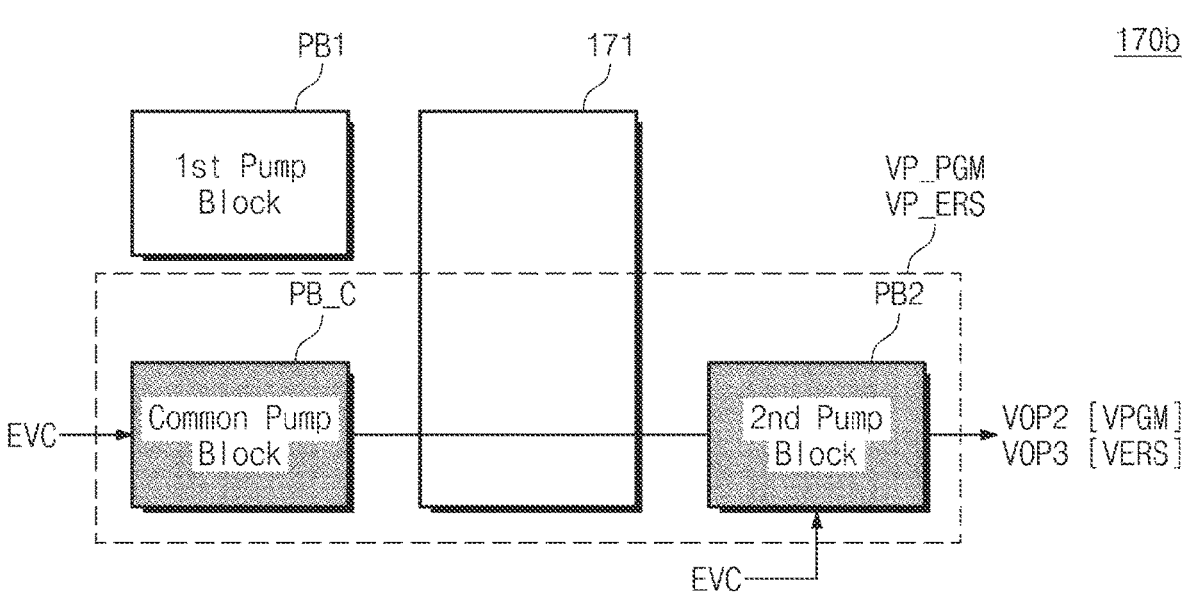

FIGS. 4 and 5 are diagrams for describing an example operation of a voltage generating circuit of FIG. 3. Below, for convenience of description, it is assumed that the first operating voltage VOP1 is a read voltage VRD of the memory device 100, the second operating voltage VOP2 is a program voltage VPGM of the memory device 100, and the third operating voltage VOP3 is an erase voltage VERS of the memory device 100. However, the present disclosure is not limited thereto.

Referring to FIGS. 1, 3, and 4, when the memory device 100 performs the read operation, the read voltage VRD to be provided to a selected word line or unselected word lines may be required. In this case, the voltage generating circuit 170 may generate the read voltage VRD (i.e., the first operating voltage VOP1) in response to the switching signal SS from the control logic circuit 160. For example, the switch block 171 of the voltage generating circuit 170 may connect the output V1 of the first pump block PB1 and the output VC of the common pump block PB_C in parallel in response to the switching signal SS. As such, the read voltage VRD (i.e., the first operating voltage VOP1) may be output.

In an implementation, the read voltage VRD may be an operating voltage corresponding to a relatively large load from among operating voltages of the memory device 100. Accordingly, as the first pump block PB1 and the common pump block PB_C are connected in parallel, the read voltage VRD (i.e., the first operating voltage VOP1) may process a relatively large load.

In an implementation, when the first pump block PB1 and the common pump block PB_C are connected in parallel, the first pump block PB1 and the common pump block PB_C may operate as a voltage pump (e.g., a read voltage pump VP_RD) for generating the read voltage VRD. In an implementation, when the read voltage VRD is generated by using the first pump block PB1 and the common pump block PB_C, the second pump block PB2 may not operate.

Next, referring to FIGS. 1, 3, and 5, when the memory device 100 performs the program operation, the program voltage VPGM to be provided to a selected word line may be required. Alternatively, when the memory device 100 performs the erase operation, the erase voltage VERS to be provided to the substrate or the common source line of the memory device 100 may be required. In this case, the voltage generating circuit 170 may generate the program voltage VPGM or the erase voltage VERS (i.e., the second operating voltage VOP2 or the third operating voltage VOP3) in response to the switching signal SS from the control logic circuit 160. For example, the switch block 171 of the voltage generating circuit 170 may serially connect the output VC of the common pump block PB_C to the second pump block PB2 in response to the switching signal SS. As such, the program voltage VPGM or the erase voltage VERS (i.e., the second operating voltage VOP2 or the third operating voltage VOP3) may be output from the second pump block PB2.

In an implementation, the program voltage VPGM or the erase voltage VERS may be an operating voltage having a relatively high target level from among operating voltages of the memory device 100. Accordingly, as the output VC of the common pump block PB_C is serially connected to the second pump block PB2, the program voltage VPGM or the erase voltage VERS of a relatively high level may be generated.

In an implementation, when the common pump block PB_C and the second pump block PB2 are connected in series, the common pump block PB_C and the second pump block PB2 may operate as voltage pump (e.g., a program voltage pump VP_VPGM or an erase voltage pump VP_VERS) for generating the program voltage VPGM or the erase voltage VERS. In an implementation, when the program voltage VPGM or the erase voltage VERS is generated by using the common pump block PB_C and the second pump block PB2, the first pump block PB1 may not operate.

As described above, the voltage generating circuit 170 of the present disclosure may use or share the common pump block PB_C for the purpose of generating various operating voltages. Accordingly, because an individual pump block is not required for each operating voltage, the whole area of the voltage generating circuit 170 may be reduced.

FIG. 6 is a block diagram illustrating an example voltage generating circuit of FIG. 1. In an implementation, it may be understood that the voltage generating circuit 170 of FIG. 1 is replaced with a voltage generating circuit 170-1 of FIG. 6. Below, for convenience of description, it is assumed that the voltage generating circuit 170-1 generates the first to third operating voltages VOP1, VOP2, and VOP3 under control of the control logic circuit 160. However, the present disclosure is not limited thereto, and the voltage generating circuit 170-1 may further generate other operating voltages.

Referring to FIGS. 1 and 6, the voltage generating circuit 170-1 may include the first pump block PB1, the second pump block PB2, a third pump block PB3, a first common pump block PB_C1, a second common pump block PB_C2, a read voltage generator GEN_RD, an erase voltage generator GEN_ERS, and the switch block 171.

The first pump block PB1, the first common pump block PB_C1, the second common pump block PB_C2, second pump block PB2, and the third pump block PB3 may operate in response to the external voltage EVC. In an implementation, the first pump block PB1 may have the first serial size s1 and the first parallel size p1, the second pump block PB2 may have the second serial size s2 and the second parallel size p2, and the third pump block PB3 may have a third serial size s3 and a third parallel size p3. The first common pump block PB_C1 may have the first serial size s1 and the second parallel size p2, and the second common pump block PB_C2 may have the first serial size s1 and the third parallel size p3.

The switch block 171 may control the connection for outputs of the first common pump block PB_C1 and the second common pump block PB_C2 in response to the switching signal SS from the control logic circuit 160. For example, in the read operation of the memory device 100, the switch block 171 may transfer or connect the outputs of the first common pump block PB_C1 and the second common pump block PB_C2 to the read voltage generator GEN_RD. In the program operation of the memory device 100, the switch block 171 may transfer or connect the output of the first common pump block PB_C1 to the second pump block PB2. In the erase operation of the memory device 100, the switch block 171 may transfer or connect the output of the first common pump block PB_C1 to the second pump block PB2 and may transfer or connect the output of the second common pump block PB_C2 to the third pump block PB3.

The read voltage generator GEN_RD may generate the first operating voltage VOP1 based on the output of the first pump block PB1 and the output of the switch block 171. For example, in the read operation of the memory device 100, the read voltage generator GEN_RD may connect the output of the first pump block PB1, the output of the first common pump block PB_C1, and the output of the second common pump block PB_C2 in parallel and may output the first operating voltage VOP1.

The erase voltage generator GEN_ERS may generate the third operating voltage VOP3 based on the output of the second pump block PB2 and the output of the third pump block PB3. For example, in the erase operation of the memory device 100, the erase voltage generator GEN_ERS may connect the output of the second pump block PB2 and the output of the third pump block PB3 in parallel and may output the third operating voltage VOP3.

As described above, as the first pump block PB1, the first common pump block PB_C1, and the second common pump block PB_C2 are connected in parallel, the first operating voltage VOP1 corresponding to a relatively large load may be generated. Alternatively, as the first common pump block PB_C1 and the second pump block PB2 are connected in series, the second operating voltage VOP2 with a relatively high level may be generated. Alternatively, as the first common pump block PB_C1 and the second pump block PB2 are connected in series, the second common pump block PB_C2 and the third pump block PB3 are connected in series, and the second pump block PB2 and the third pump block PB3 are connected in parallel, the third operating voltage VOP3 corresponding to a relatively large load and having a relatively high level may be generated. In this case, because the first common pump block PB_C1 and the second common pump block PB_C2 are used in common or are shared to generate respective operating voltages, the whole area of the voltage generating circuit 170-1 may be reduced.

Figure 7:
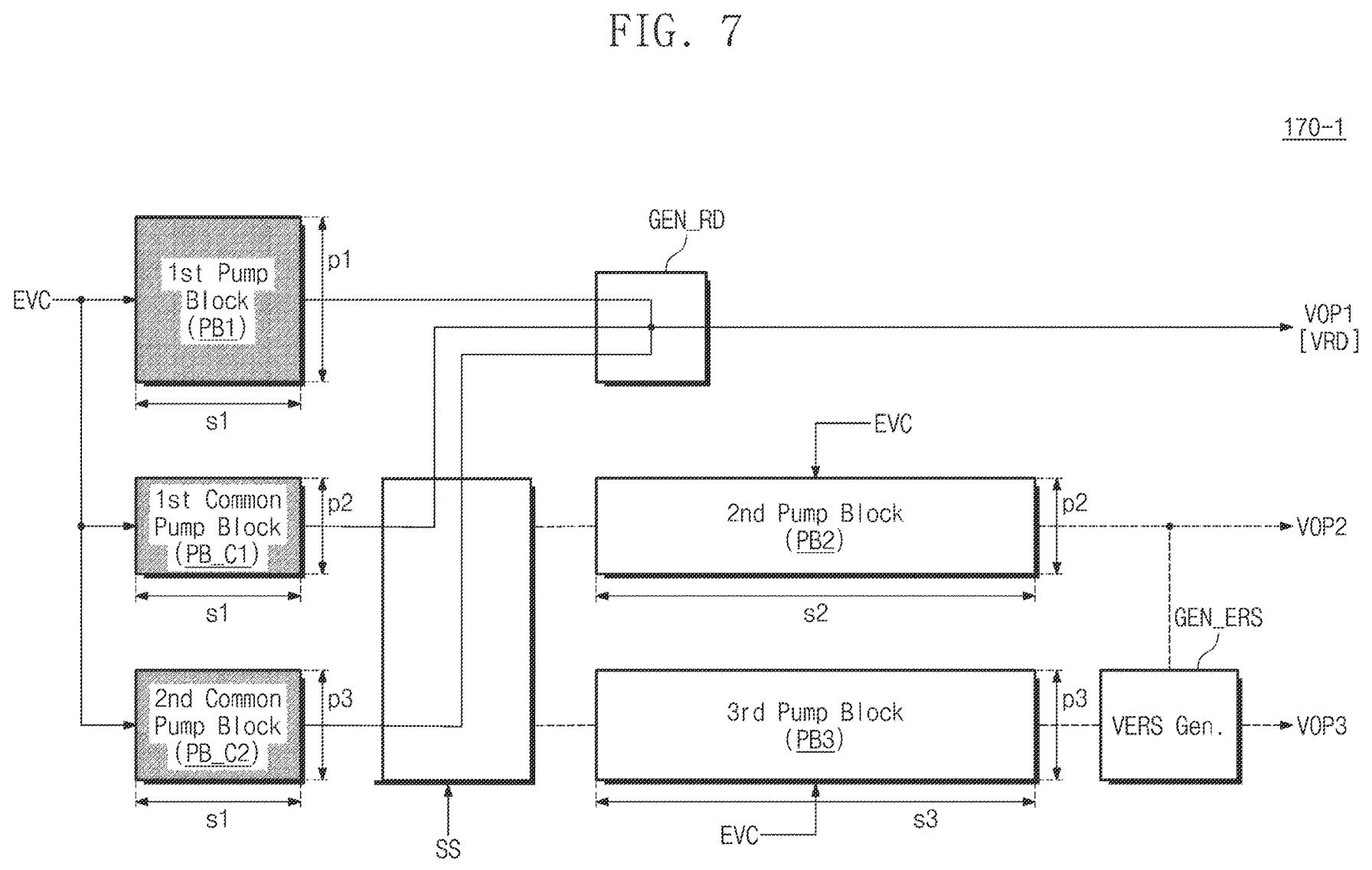

FIGS. 7 to 9 are diagrams for describing example operations of a voltage generating circuit of FIG. 6. A configuration in which the voltage generating circuit 170-1 generates the read voltage VRD, the program voltage VPGM, or the erase voltage VERS will be described with reference to FIGS. 7 to 9. However, the present disclosure is not limited thereto, and the voltage generating circuit 170-1 may further generate various other operating voltages.

Referring to FIGS. 1, 6, and 7, the memory device 100 may perform the read operation. In this case, the voltage generating circuit 170-1 may generate the read voltage VRD in response to the switching signal SS from the control logic circuit 160.

For example, in the read operation of the memory device 100, the first pump block PB1, the first common pump block PB_C1, and the second common pump block PB_C2 may be activated. In response to the switching signal SS, the switch block 171 provides the outputs of the first common pump block PB_C1 and the second common pump block PB_C2 to the read voltage generator GEN_RD. The read voltage generator GEN_RD may connect the output of the first pump block PB1, the output of the first common pump block PB_C1, and the output of the second common pump block PB_C2 in parallel and may output the first operating voltage VOP1 (or the read voltage VRD).

In an implementation, as in the above description, in the read operation of the memory device 100, the read voltage VRD may be generated based on the first pump block PB1, the first common pump block PB_C1, and the second common pump block PB_C2. That is, in the read operation of the memory device 100, the first pump block PB1, the first common pump block PB_C1, and the second common pump block PB_C2 may operate as a read voltage pump. Because pump blocks (e.g., PB1, PB_C1, and PB_C2) included in the read voltage pump are connected in parallel, each pump block may have the output voltage of the same level. In this case, as described above, the serial size of each pump block may correspond to a level of an output voltage. That is, the first pump block PB1, the first common pump block PB_C1, and the second common pump block PB_C2 may have the same serial size (e.g., s1). In an implementation, because the pump blocks (e.g., PB1, PB_C1, and PB_C2) included in the read voltage pump are connected in parallel, a sum parallel size of the read voltage pump may be (p1+p2+p3). That is, as the parallel size increases, the read voltage VRD corresponding to a relatively large load may be normally generated.

In an implementation, while the memory device 100 performs the read operation, the second pump block PB2 and the third pump block PB3 may be deactivated or may not be used.

Next, referring to FIGS. 1, 6, and 8, the memory device 100 may perform the program operation. In this case, the voltage generating circuit 170-1 may generate the program voltage VPGM in response to the switching signal SS from the control logic circuit 160.

For example, in the program operation of the memory device 100, the first common pump block PB_C1 and the second pump block PB2 may be activated. In response to the switching signal SS, the switch block 171 may transfer the output of the first common pump block PB_C1 to the second pump block PB2. The second pump block PB2 and the first common pump block PB_C1 may be connected in series. The second pump block PB2 may output the second operating voltage VOP2 (or the program voltage VPGM).

In an implementation, as in the above description, in the program operation of the memory device 100, the program voltage VPGM may be generated based on the first common pump block PB_C1 and the second pump block PB2. That is, in the program operation of the memory device 100, the first common pump block PB_C1 and the second pump block PB2 may operate as a program voltage pump. Because pump blocks (e.g., PB_C1 and PB2) included in the program voltage pump are connected in series, the pump blocks may have the same parallel size (e.g., p2) for an efficient operation. In an implementation, because the pump blocks (e.g., PB_C1 and PB2) included in the program voltage pump are connected in series, a sum serial size of the program voltage pump may be (s1+s2). That is, as the serial size increases, the program voltage VPGM with a relatively high level may be normally generated.

In an implementation, while the memory device 100 performs the program operation, the first pump block PB1, the second common pump block PB_C2, and the third pump block PB3 may be deactivated. In an implementation, while the memory device 100 performs the program operation, the first pump block PB1 may be used to generate a pass voltage or a program verify voltage.

Next, referring to FIGS. 1, 6, and 9, the memory device 100 may perform the erase operation. In this case, the voltage generating circuit 170-1 may generate the erase voltage VERS in response to the switching signal SS from the control logic circuit 160.

For example, in the erase operation of the memory device 100, the first common pump block PB_C1, the second common pump block PB_C2, the second pump block PB2, and the third pump block PB3 may be activated. In response to the switching signal SS, the switch block 171 may transfer the output of the first common pump block PB_C1 to the second pump block PB2 and may transfer the output of the second common pump block PB_C2 to the third pump block PB3. The second pump block PB2 and the first common pump block PB_C1 may be connected in series, and the third pump block PB3 and the second common pump block PB_C2 may be connected in series. The output of the second pump block PB2 and the output of the third pump block PB3 may be provided to the erase voltage generator GEN_ERS. The erase voltage generator GEN_ERS may connect the output of the second pump block PB2 and the output of the third pump block PB3 in parallel and may generate the third operating voltage VOP3 (or the erase voltage VERS).

In an implementation, as in the above description, in the erase operation of the memory device 100, the erase voltage VERS may be generated based on the first common pump block PB_C1, the second common pump block PB_C2, the second pump block PB2, and the third pump block PB3. That is, in the erase operation of the memory device 100, the first common pump block PB_C1, the second common pump block PB_C2, the second pump block PB2, and the third pump block PB3 may be used as an erase voltage pump.

Because pump blocks (e.g., PB_C1, PB_C2, PB2, and PB3) included in the erase voltage pump are connected in series or in parallel, some pump blocks may have the same parallel size for an efficient operation. For example, the first common pump block PB_C1 and the second pump block PB2 connected in series may have the same parallel size (e.g., p2). The second common pump block PB_C2 and the third pump block PB3 connected in series may have the same parallel size (e.g., p3). In an implementation, because the output of the second pump block PB2 and the output of the third pump block PB3 are connected in parallel by the erase voltage generator GEN_ERS, the output of the second pump block PB2 and the output of the third pump block PB3 may have the same level. Because the output of the second pump block PB2 is generated by the first common pump block PB_C1 and the second pump block PB2 connected in series and the output of the third pump block PB3 is generated by the second common pump block PB_C2 and the third pump block PB3 connected in series, the serial size (i.e., s1+s2) of the first common pump block PB_C1 and the second pump block PB2 connected in series may be identical to the serial size (i.e., s1+s3) of the second common pump block PB_C2 and the third pump block PB3 connected in series. Accordingly, the erase voltage VERS having a relatively high level and corresponding to a relatively large load may be normally generated.

Figure 10:
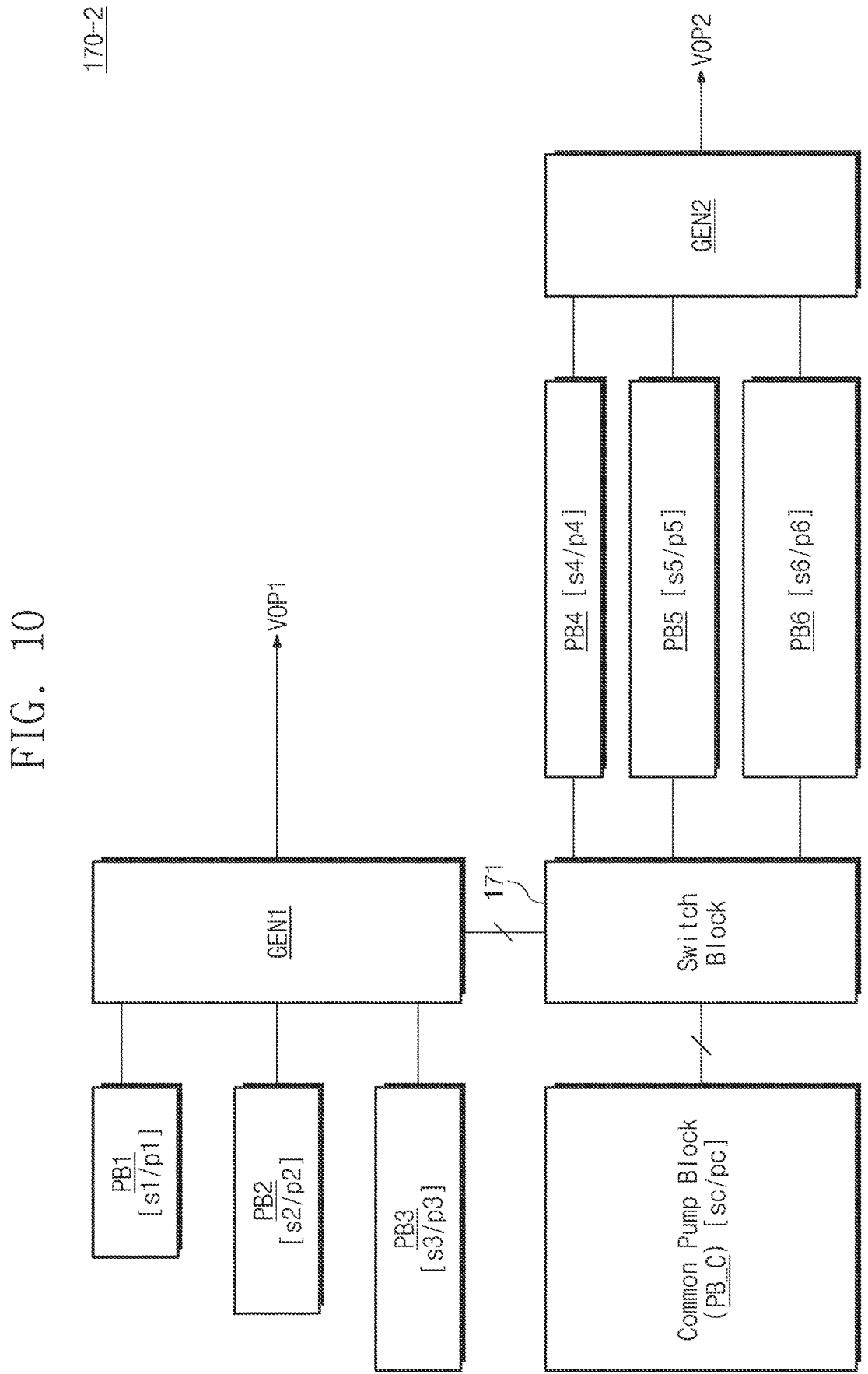
FIG. 10 is a block diagram illustrating an example voltage generating circuit of FIG. 1.

FIG. 10 is a block diagram illustrating an example voltage generating circuit of FIG. 1. For convenience of description, the description which is the same as the above description will be omitted to avoid redundancy. Referring to FIGS. 1 and 10, a voltage generating circuit 170-2 may include a plurality of pump blocks PB1, PB2, PB3, PB4, PB5, and PB6, the common pump block PB_C, the switch block 171, a first voltage generator GEN1, and a second voltage generator GEN2.

The plurality of pump blocks PB1, PB2, PB3, PB4, PB5, and PB6 and the common pump block PB_C may operate by using the external voltage EVC. Outputs of the first to third pump blocks PB1, PB2, and PB3 among the plurality of pump blocks PB1, PB2, PB3, PB4, PB5, and PB6 may be provided to the first voltage generator GEN1, and outputs of the fourth to sixth pump blocks PB4, PB5, and PB6 among the plurality of pump blocks PB1, PB2, PB3, PB4, PB5, and PB6 may be provided to the second voltage generator GEN2.

The switch block 171 may connect at least some of the outputs of the common pump block PB_C to the first voltage generator GEN1 or may provide at least some of the outputs of the common pump block PB_C to the fourth to sixth pump blocks PB4, PB5, and PB6.

The first voltage generator GEN1 may receive the outputs of the first to third pump blocks PB1, PB2, and PB3 and may be connected to at least some of the outputs of the common pump block PB_C through the switch block 171. The first voltage generator GEN1 may connect the received outputs in parallel to generate the first operating voltage VOP1.

The second voltage generator GEN2 may receive outputs of the fourth to sixth pump blocks PB4, PB5, and PB6 and may connect the received outputs in parallel to output the second operating voltage VOP2. In an implementation, at least some of the fourth to sixth pump blocks PB4, PB5, and PB6 may be connected in series to at least some of the outputs of the common pump block PB_C through the switch block 171. That is, the fourth to sixth pump blocks PB4, PB5, and PB6 may output a voltage of a relatively high level through the serial connection described above.

In an implementation, the first pump block PB1 may have the first serial size s1 and the first parallel size p1. The second pump block PB2 may have the second serial size s2 and the second parallel size p2. The third pump block PB3 may have the third serial size s3 and the third parallel size p3. The fourth pump block PB4 may have a fourth serial size s4 and a fourth parallel size p4. The fifth pump block PB5 may have a fifth serial size s5 and a fifth parallel size p5. The sixth pump block PB6 may have a sixth serial size s6 and a sixth parallel size p6.

The common pump block PB_C may have a serial size of sc and a parallel size of pc. In this case, unit pumps included in the common pump block PB_C may be divided or reconfigured to various serial sizes and various parallel sizes.

As described above, the voltage generating circuit 170-2 may include a plurality of pump blocks and may generate various operating voltages through a combination of the plurality of pump blocks and the common pump block. In this case, unit pumps included in the common pump block PB_C may be divided or reconfigured to various serial sizes and various parallel sizes, and the reconfigured portions and the plurality of pump blocks may form the serial connection, the parallel connection, or the series-parallel connection. In this case, in generating various operating voltages, because at least some of the unit pumps of the common pump block are used in common or are shared, the whole area of the voltage generating circuit 170-2 may be reduced.

FIGS. 11 to 15 are diagrams for describing example operations of a voltage generating circuit of FIG. 10. For convenience of description, an example of generating some operating voltages will be described, but the present disclosure is not limited thereto.

Figure 11:
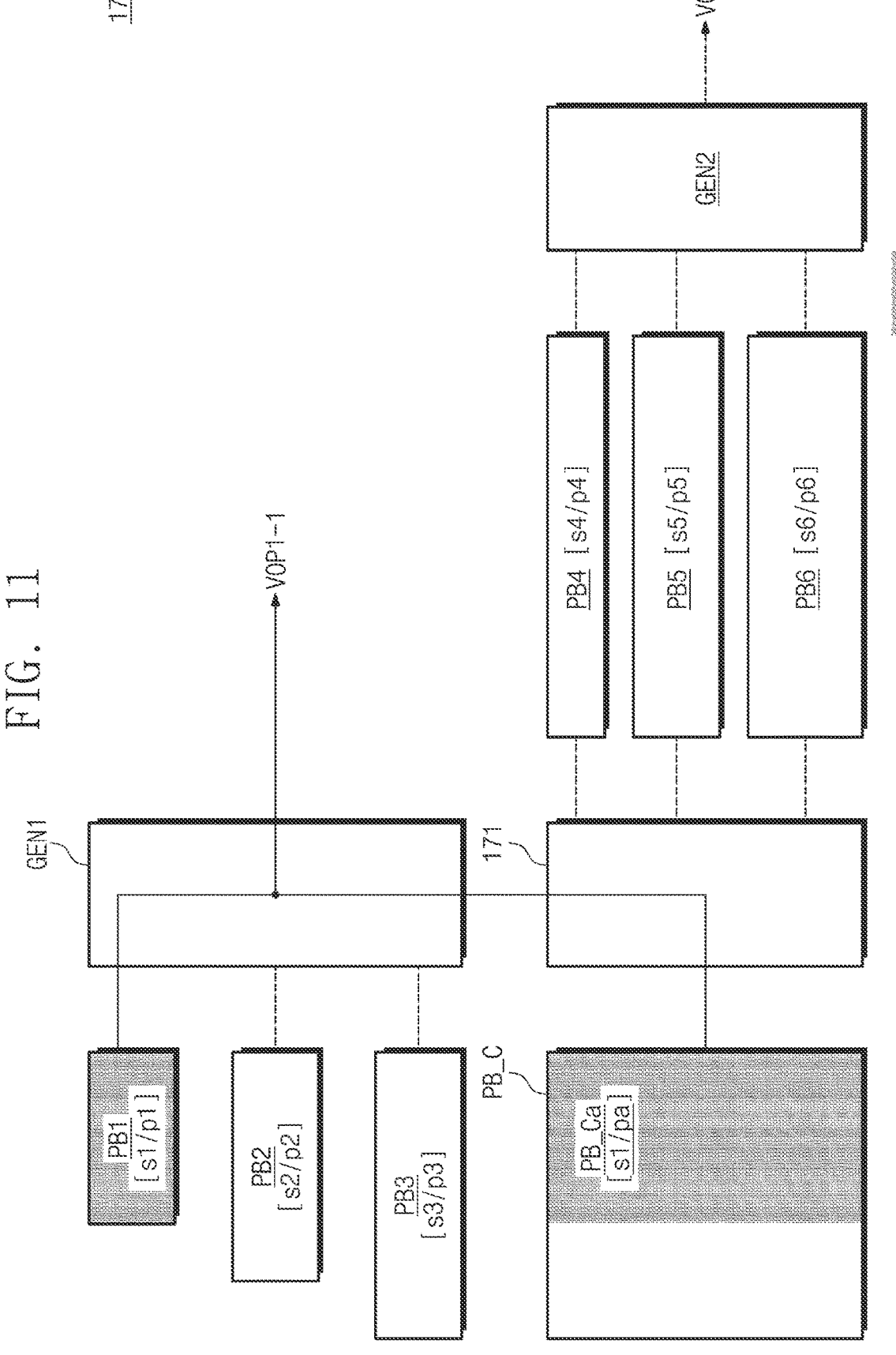

Referring to FIGS. 1, 10, and 11, the voltage generating circuit 170-2 may generate a 1-1st operating voltage VOP1-1 by using the first pump block PB1 and an a-th portion PB_Ca of the common pump block PB_C. For example, when the 1-1st operating voltage VOP1-1 is required, the first pump block PB1 and the a-th portion PB_Ca of the common pump block PB_C may be activated. The a-th portion PB_Ca of the common pump block PB_C may include some of a plurality of unit pumps included in the common pump block PB_C. The a-th portion PB_Ca of the common pump block PB_C may have a serial size of s1 and may have a parallel size of pa. That is, the unit pumps included in the a-th portion PB_Ca of the common pump block PB_C may be series-parallel connected to correspond to the serial size of s1 and the parallel size of pa.

The switch block 171 may transfer the output of the a-th portion PB_Ca of the common pump block PB_C to the first voltage generator GEN1. The first voltage generator GEN1 may connect the output of the first pump block PB1 and the output of the a-th portion PB_Ca of the common pump block PB_C in parallel to output the 1-1st operating voltage VOP1-1.

In an implementation, because the output of the first pump block PB1 and the output of the a-th portion PB_Ca of the common pump block PB_C are connected in parallel, as in the above description, the first pump block PB1 and the a-th portion PB_Ca of the common pump block PB_C may have the same serial size (e.g., s1). That is, the a-th portion PB_Ca of the common pump block PB_C may include at least some of the plurality of unit pumps of the common pump block PB_C, and the at least some unit pumps may be connected to have the serial size of s1.

In an implementation, because the output of the first pump block PB1 and the output of the a-th portion PB_Ca of the common pump block PB_C are connected in parallel to generate the 1-1st operating voltage VOP1-1, a parallel size of a sum voltage pump for generating the 1-1st operating voltage VOP1-1 may correspond to (p1+pa).

In an implementation, when the 1-1st operating voltage VOP1-1 is generated, the remaining pump blocks PB2, PB3, PB4, PB5, and PB6 and the remaining portion of the common pump block PB_C may be deactivated. Alternatively, the remaining pump blocks PB2, PB3, PB4, PB5, and PB6 and the remaining portion of the common pump block PB_C may be used to generate any other operating voltage.

Figure 12:
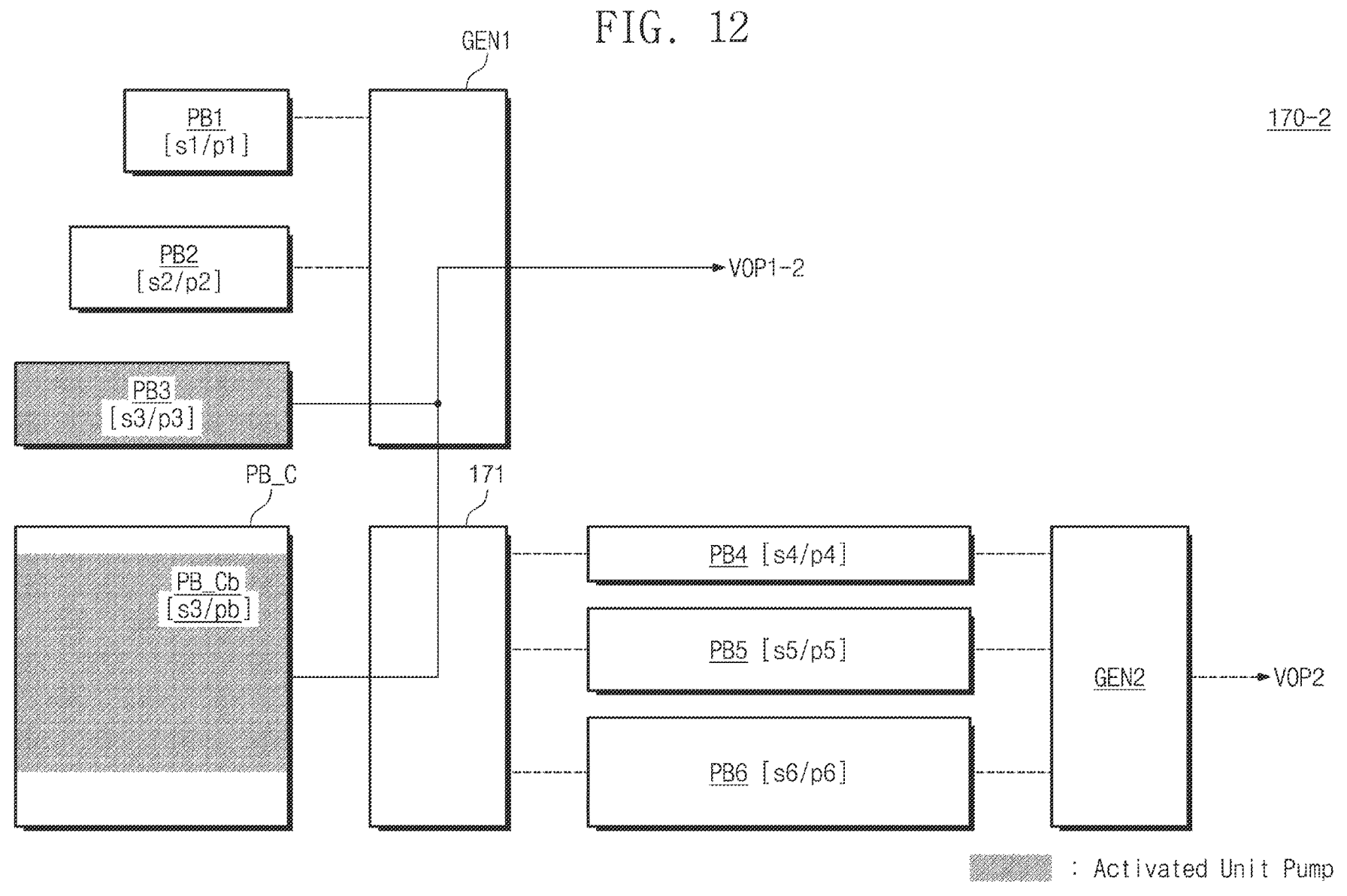

Next, referring to FIGS. 1, 10, and 12, the voltage generating circuit 170-2 may generate a 1-2nd operating voltage VOP1-2 by using the third pump block PB3 and a b-th portion PB_Cb of the common pump block PB_C. For example, when the 1-2nd operating voltage VOP1-2 is required, the third pump block PB3 and the b-th portion PB_Cb of the common pump block PB_C may be activated. The b-th portion PB_Cb of the common pump block PB_C may include some of the plurality of unit pumps included in the common pump block PB_C. The b-th portion PB_Cb of the common pump block PB_C may have a serial size of s3 and may have a parallel size of pb. That is, the unit pumps included in the b-th portion PB_Cb of the common pump block PB_C may be series-parallel connected to correspond to the serial size of s3 and the parallel size of pb.

The switch block 171 may transfer the output of the b-th portion PB_Cb of the common pump block PB_C to the first voltage generator GEN1. The first voltage generator GEN1 may connect the output of the third pump block PB3 and the output of the b-th portion PB_Cb of the common pump block PB_C in parallel to output the 1-2nd operating voltage VOP1-2.

In an implementation, because the output of the third pump block PB3 and the output of the b-th portion PB_Cb of the common pump block PB_C are connected in parallel, as in the above description, the third pump block PB3 and the b-th portion PB_Cb of the common pump block PB_C may have the same serial size (e.g., s3).

In an implementation, because the output of the third pump block PB3 and the output of the b-th portion PB_Cb of the common pump block PB_C are connected in parallel to generate the 1-2nd operating voltage VOP1-2, a parallel size of a sum voltage pump for generating the 1-2nd operating voltage VOP1-2 may correspond to (p3+pb).

In an implementation, when the 1-2nd operating voltage VOP1-2 is generated, the remaining pump blocks PB1, PB2, PB4, PB5, and PB6 and the remaining portion of the common pump block PB_C may be deactivated. Alternatively, the remaining pump blocks PB1, PB2, PB4, PB5, and PB6 and the remaining portion of the common pump block PB_C may be used to generate any other operating voltage.

In an implementation, the serial size (i.e., s1) of the first pump block PB1 may be smaller than the serial size (i.e., s3) of the third pump block PB3. In this case, as described above, the 1-1st operating voltage VOP1-1 generated by the first pump block PB1 and the a-th portion PB_Ca of the common pump block PB_C may be lower than the 1-2nd operating voltage VOP1-2 generated by the third pump block PB3 and the b-th portion PB_Cb of the common pump block PB_C.

Figure 13:
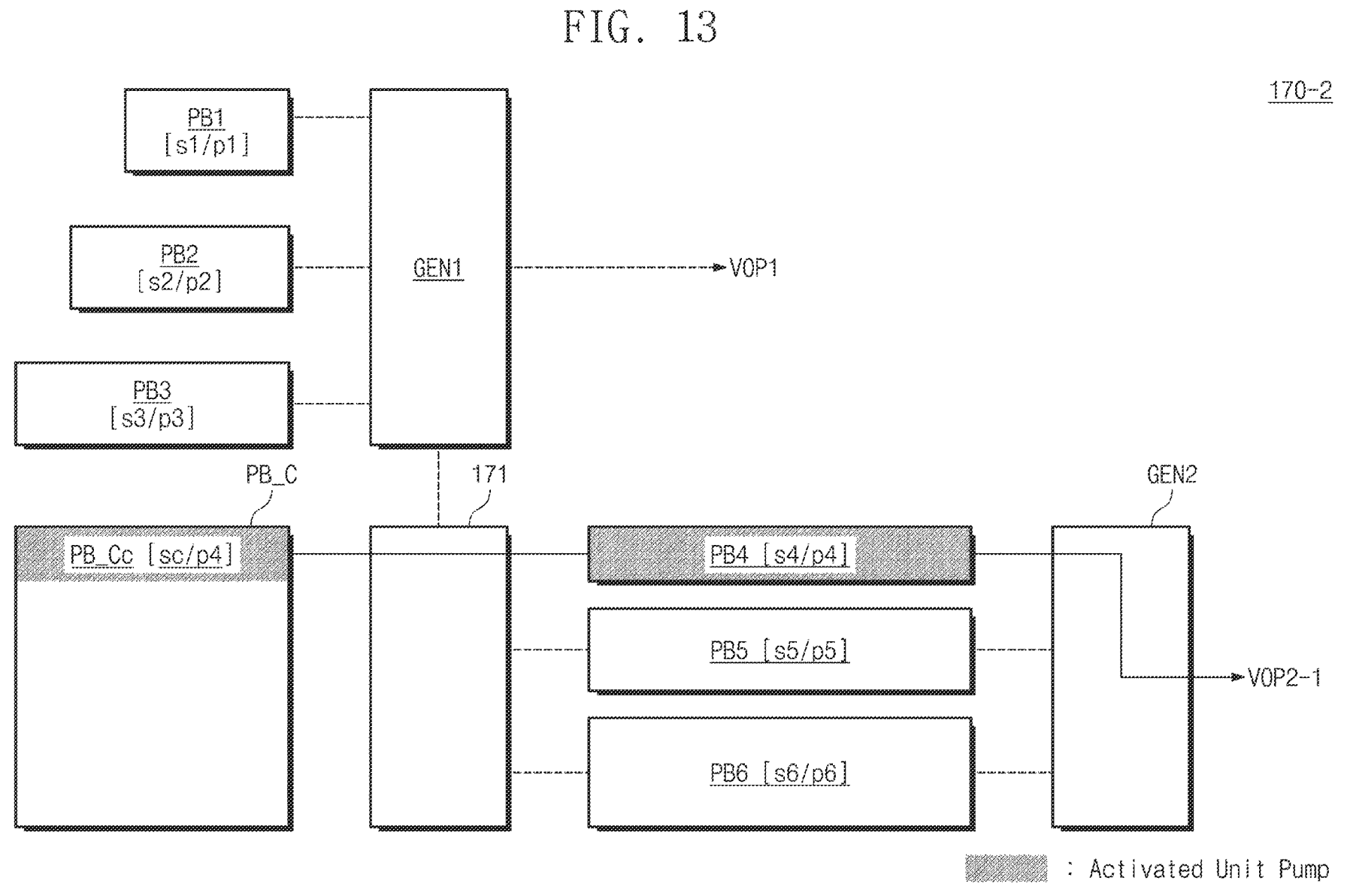

Next, referring to FIGS. 1, 10, and 13, the voltage generating circuit 170-2 may generate a 2-1st operating voltage VOP2-1 by using the fourth pump block PB4 and a c-th portion PB_Cc of the common pump block PB_C. For example, when the 2-1st operating voltage VOP2-1 is required, the fourth pump block PB4 and the c-th portion PB_Cc of the common pump block PB_C may be activated. The c-th portion PB_Cc of the common pump block PB_C may include some of the plurality of unit pumps included in the common pump block PB_C. The c-th portion PB_Cc of the common pump block PB_C may have a serial size of sc and may have a parallel size of p4. That is, the unit pumps included in the c-th portion PB_Cc of the common pump block PB_C may be series-parallel connected to correspond to the serial size of sc and the parallel size of p4.

The switch block 171 may transfer the output of the c-th portion PB_Cc of the common pump block PB_C to the fourth pump block PB4. The fourth pump block PB4 and the output of the common pump block PB_C of the common pump block PB_C may be connected in series. The output of the fourth pump block PB4 may be provided to the second voltage generator GEN2. The second voltage generator GEN2 may output the 2-1st operating voltage VOP2-1 based on the output of the fourth pump block PB4.

In an implementation, because the fourth pump block PB4 and the c-th portion PB_Cc of the common pump block PB_C are connected in series, as in the above description, the fourth pump block PB4 and the c-th portion PB_Cc of the common pump block PB_C may have the same parallel size (e.g., p4).

In an implementation, because the output of the c-th portion PB_Cc of the common pump block PB_C and the output of the fourth pump block PB4 are connected in series to generate the 2-1st operating voltage VOP2-1, a serial size of a sum voltage pump for generating the 2-1st operating voltage VOP2-1 may correspond to (sc+s4).

In an implementation, when the 2-1st operating voltage VOP2-1 is generated, the remaining pump blocks PB1, PB2, PB3, PB5, and PB6 and the remaining portion of the common pump block PB_C may be deactivated. Alternatively, the remaining pump blocks PB1, PB2, PB3, PB5, and PB6 and the remaining portion of the common pump block PB_C may be used to generate any other operating voltage.

Next, referring to FIGS. 1, 10, and 14, the voltage generating circuit 170-2 may generate a 2-2nd operating voltage VOP2-2 by using the fifth pump block PB5, the sixth pump block PB6, and a d-th portion PB_Cd and an e-th portion PB_Ce of the common pump block PB_C. For example, when the 2-2nd operating voltage VOP2-2 is required, the fifth pump block PB5, the sixth pump block PB6, and the d-th portion PB_Cd and the e-th portion PB_Ce of the common pump block PB_C may be activated. Each of the d-th portion PB_Cd and the e-th portion PB_Ce of the common pump block PB_C may include some of the plurality of unit pumps included in the common pump block PB_C. The d-th portion PB_Cd of the common pump block PB_C may have a serial size of sd and a parallel size of p5, and the e-th portion PB_Ce of the common pump block PB_C may have a serial size of se and a parallel size of p6. That is, the unit pumps included in the d-th portion PB_Cd of the common pump block PB_C may be series-parallel connected to correspond to the serial size of sd and the parallel size of p5, and the unit pumps included in the e-th portion PB_Ce of the common pump block PB_C may be series-parallel connected to correspond to the serial size of se and the parallel size of p6.

The switch block 171 may transfer the output of the d-th portion PB_Cd of the common pump block PB_C to the fifth pump block PB5 and may transfer the output of the e-th portion PB_Ce of the common pump block PB_C to the sixth pump block PB6. The fifth pump block PB5 and the d-th portion PB_Cd of the common pump block PB_C may be connected in series, and the sixth pump block PB6 and the e-th portion PB_Ce of the common pump block PB_C may be connected in series.

The output of the fifth pump block PB5 and the d-th portion PB_Cd of the common pump block PB_C connected in series may be provided to the second voltage generator GEN2, and the output of the sixth pump block PB6 and the e-th portion PB_Ce of the common pump block PB_C connected in series may be provided to the second voltage generator GEN2. The second voltage generator GEN2 may connect the received voltages in parallel to generate the 2-2nd operating voltage VOP2-2.

In an implementation, because the fifth pump block PB5 and the d-th portion PB_Cd of the common pump block PB_C are connected in series, as in the above description, the fifth pump block PB5 and the d-th portion PB_Cd of the common pump block PB_C may have the same parallel size (e.g., p5). Because the sixth pump block PB6 and the e-th portion PB_Ce of the common pump block PB_C are connected in series, as in the above description, the sixth pump block PB6 and the e-th portion PB_Ce of the common pump block PB_C may have the same parallel size (e.g., p6).

In an implementation, because the fifth pump block PB5 and the d-th portion PB_Cd of the common pump block PB_C connect in series and the sixth pump block PB6 and the e-th portion PB_Ce of the common pump block PB_C connect in series, and both combinations are connected in parallel, the serial size of the fifth pump block PB5 and the d-th portion PB_Cd of the common pump block PB_C connected in series and the serial size of the sixth pump block PB6 and the e-th portion PB_Ce of the common pump block PB_C connected in series are connected in parallel may be identical (i.e., sd+s5=se+s6).

In an implementation, when the 2-2nd operating voltage VOP2-2 is generated, the remaining pump blocks PB1, PB2, PB3, and PB4 and the remaining portion of the common pump block PB_C may be deactivated. Alternatively, the remaining pump blocks PB1, PB2, PB3, and PB4 and the remaining portion of the common pump block PB_C may be used to generate any other operating voltage.

Figure 15:
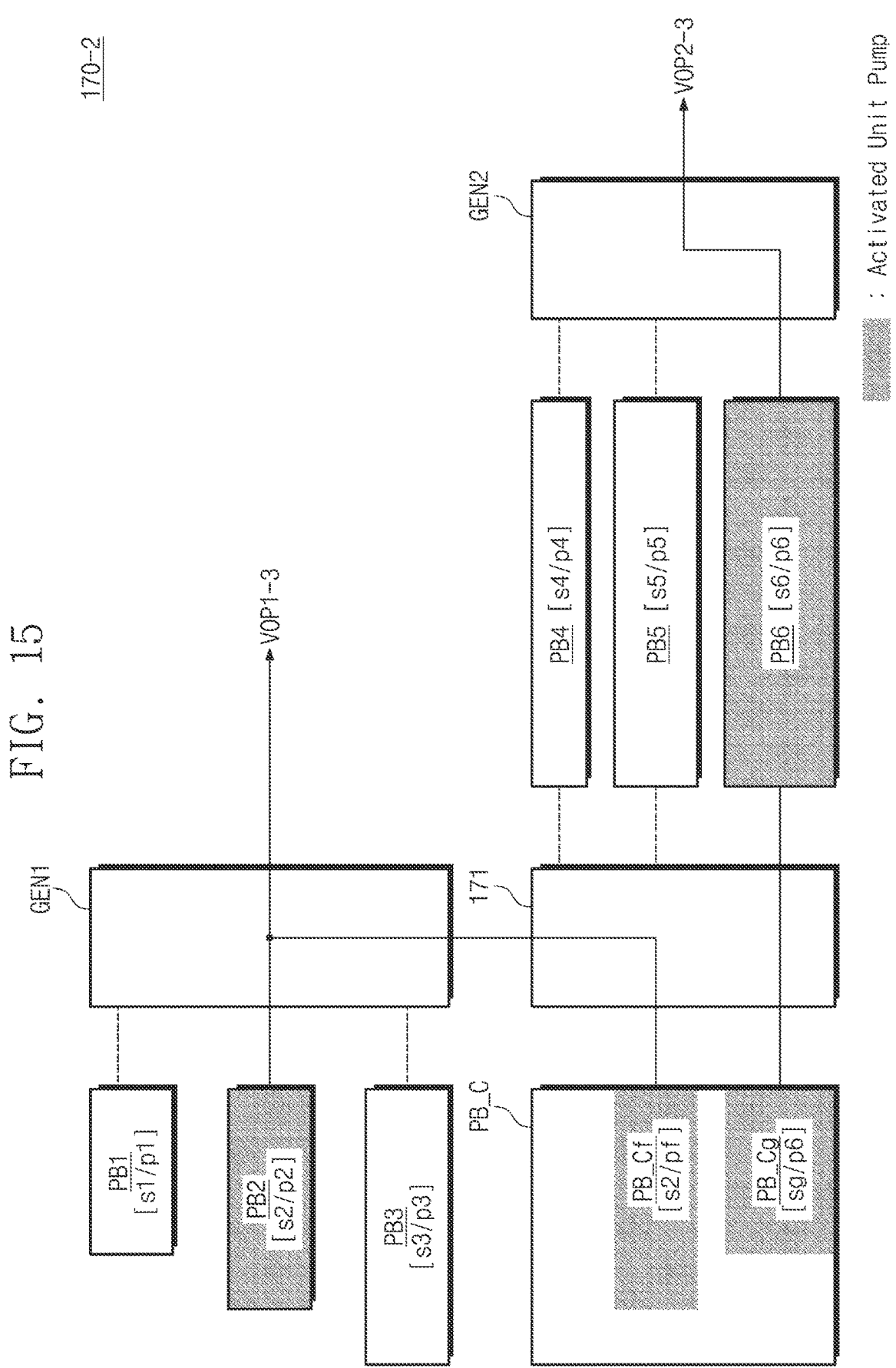

Next, referring to FIGS. 1, 10, and 15, the voltage generating circuit 170-2 may generate a 1-3rd operating voltage VOP1-3 and a 2-3rd operating voltage VOP2-3. For example, when the 1-3rd operating voltage VOP1-3 and the 2-3rd operating voltage VOP2-3 are required, the second pump block PB2, the sixth pump block PB6, and an f-th portion PB_Cf and a g-th portion PB_Cg of the common pump block PB_C may be activated. Each of the f-th portion PB_Cf and the g-th portion PB_Cg of the common pump block PB_C may include some of the plurality of unit pumps included in the common pump block PB_C. The f-th portion PB_Cf of the common pump block PB_C may have a serial size of s2 and a parallel size of pf, and the g-th portion PB_Cg of the common pump block PB_C may have a serial size of sg and a parallel size of p6. That is, the unit pumps included in the f-th portion PB_Cf of the common pump block PB_C may be series-parallel connected to correspond to the serial size of s2 and the parallel size of pf, and the unit pumps included in the g-th portion PB_Cg of the common pump block PB_C may be series-parallel connected to correspond to the serial size of sg and the parallel size of p6.

The switch block 171 may transfer the output of the f-th portion PB_Cf of the common pump block PB_C to the first voltage generator GEN1 and may provide the output of the g-th portion PB_Cg of the common pump block PB_C to the sixth pump block PB6. The first voltage generator GEN1 may connect the output of the f-th portion PB_Cf of the common pump block PB_C and the output of the second pump block PB2 in parallel to generate the 1-3rd operating voltage VOP1-3. As the sixth pump block PB6 and the g-th portion PB_Cg of the common pump block PB_C are connected in series, the sixth pump block PB6 may output the 2-3rd operating voltage VOP2-3.

In an implementation, because the f-th portion PB_Cf of the common pump block PB_C and the second pump block PB2 are connected in parallel, the f-th portion PB_Cf of the common pump block PB_C and the second pump block PB2 may have the same serial size (e.g., s2). Because the g-th portion PB_Cg of the common pump block PB_C and the sixth pump block PB6 are connected in series, the g-th portion PB_Cg of the common pump block PB_C and the sixth pump block PB6 may have the same parallel size (e.g., p6).

In an implementation, when the 1-3rd operating voltage VOP1-3 and the 2-3rd operating voltage VOP2-3 are generated, the remaining pump blocks PB1, PB3, PB4, and PB5 and the remaining portion of the common pump block PB_C may be deactivated. Alternatively, the remaining pump blocks PB1, PB3, PB4, and PB5 and the remaining portion of the common pump block PB_C may be used to generate any other operating voltage.

As described above, a voltage generating circuit may generate various operating voltages by using a plurality of pump blocks and a common pump block. In this case, as the common pump block and any other pump blocks are connected in series or in parallel, various operating voltages may be generated. That is, when various operating voltages are generated, the common pump block may be used in common or may be shared. Accordingly, the whole area of the voltage generating circuit may be reduced.

Figure 16:
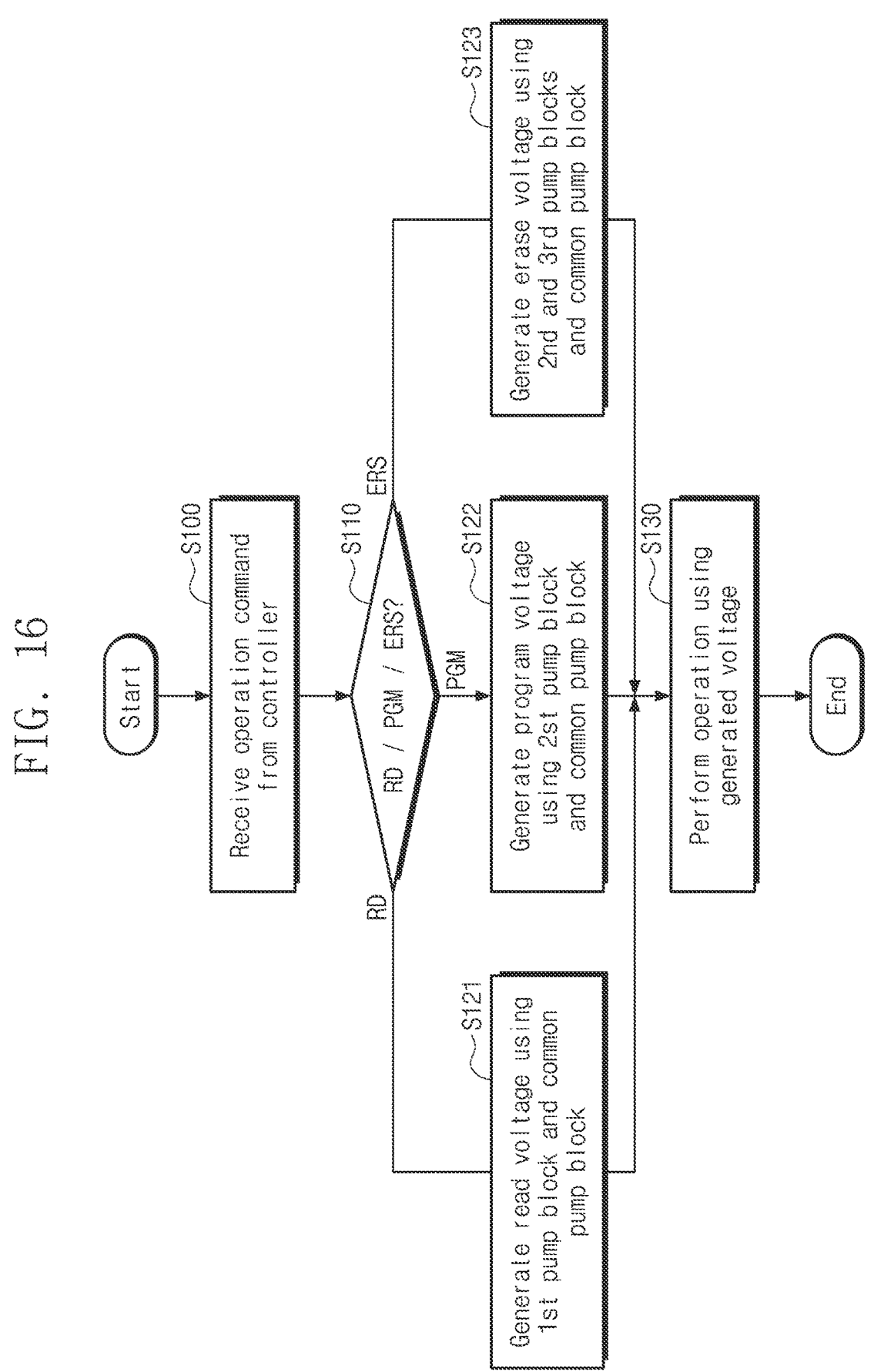
FIG. 16 is a flowchart illustrating an example operation of the memory device of FIG. 1.

FIG. 16 is a flowchart illustrating an example operation of a memory device of FIG. 1. Referring to FIGS. 1 and 16, in operation S100, the memory device 100 may receive an operation command from an external device (e.g., a controller). In an implementation, the operation command may include a read command, a program command, or an erase command.

In operation S110, the memory device 100 may determine a type of the received operation command. For example, the control logic circuit 160 of the memory device 100 may decode the operation command received from the external device and may determine a type of the operation command based on a decoding result.

When the operation command is the read command, in operation S121, the memory device 100 may generate a read voltage. For example, the voltage generating circuit 170 of the memory device 100 may generate the read voltage by using a first pump block and a common pump block. In an implementation, the read voltage may have a relatively low level and may correspond to a relatively large load. In this case, the voltage generating circuit 170 may connect the first pump block and the common pump block in parallel and may generate the read voltage.

When the operation command is the program command, in operation S122, the memory device 100 may generate a program voltage. For example, the voltage generating circuit 170 of the memory device 100 may generate the program voltage by using a second pump block and the common pump block. In an implementation, the program voltage may have a relatively high level and may correspond to a relatively small load. In this case, the voltage generating circuit 170 may connect the second pump block and the common pump block in series and may generate the program voltage.

When the operation command is the erase command, in operation S123, the memory device 100 may generate an erase voltage. For example, the voltage generating circuit 170 of the memory device 100 may generate the erase voltage by using the second pump block, a third pump block, and the common pump block. In an implementation, the erase voltage may have a relatively high level and may correspond to a relatively large load. In this case, the voltage generating circuit 170 may generate the erase voltage by connecting the common pump block with each of the second and third pump blocks in series and connecting outputs of the second and third pump blocks in parallel.

In an implementation, the memory device 100 may further generate various operating voltages necessary to perform the read operation, the program operation, and the erase operation.

In operation S130, the memory device 100 may perform an operation corresponding to the operation command based on the generated voltage. For example, when the operation command is the read command, the memory device 100 may perform the read operation by using the generated read voltage. When the operation command is the program command, the memory device 100 may perform the program operation by using the generated program voltage. When the operation command is the erase command, the memory device 100 may perform the erase operation by using the generated erase voltage.

Figure 17:
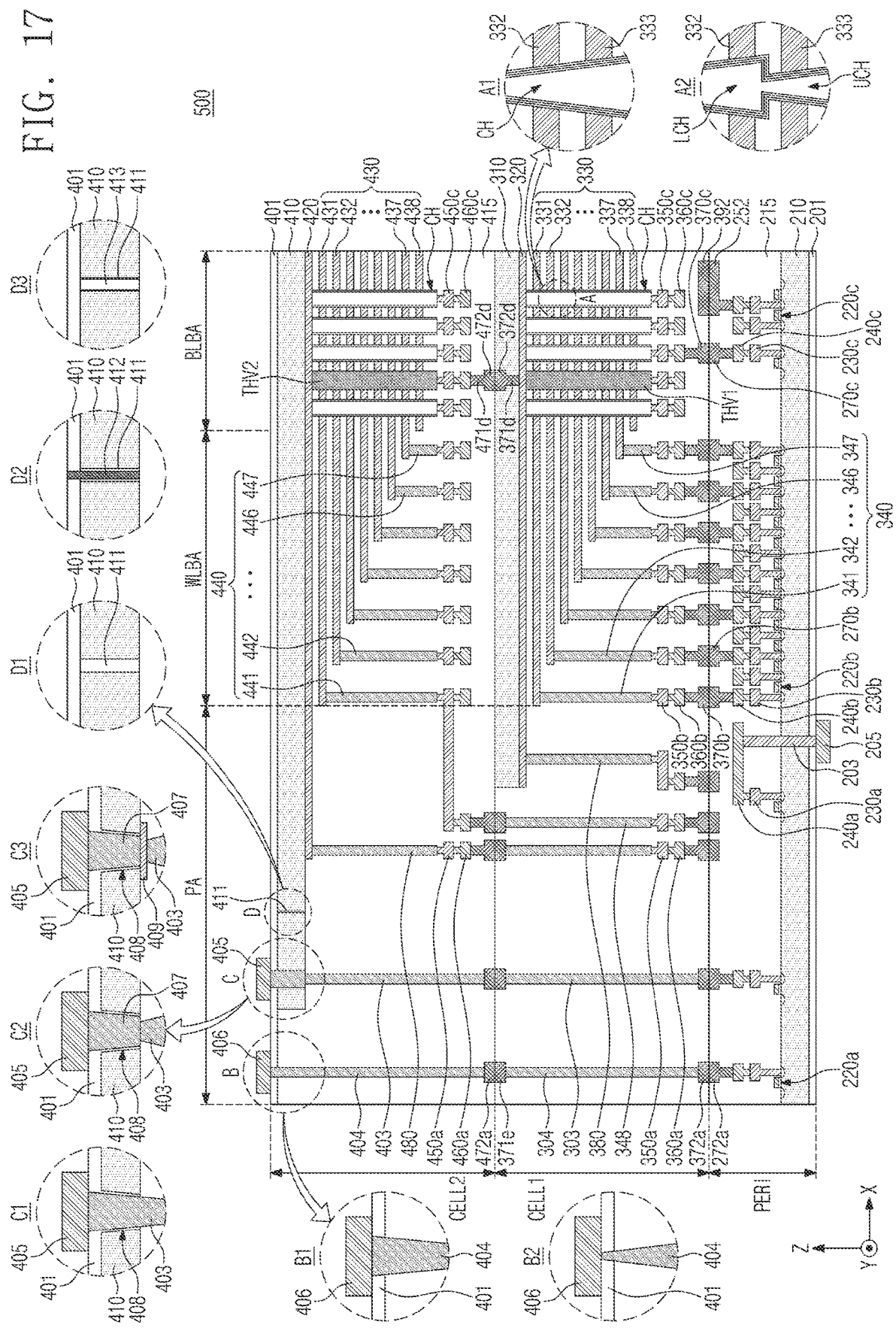
FIG. 17 is a diagram for describing an example memory device.

FIG. 17 is a cross-sectional view illustrating an example memory device 500.

Referring to FIG. 17, the memory device 500 may have a chip-to-chip (C2C) structure. Herein, in the C2C structure, after fabricating at least one upper chip including a cell region CELL and at least one lower chip including a peripheral circuit region PERI, respectively, the upper chip and the lower chip may be bonded to each other by a bonding method. As an example, the bonding method may mean a method of electrically or physically connecting a bonding metal pattern formed in the uppermost metal layer of the upper chip and a bonding metal pattern formed in the uppermost metal layer of the lower chip. For example, when the bonding metal patterns are formed of copper (Cu), the bonding method may be referred to as a "Cu—Cu bonding method". As another example, the bonding metal patterns may also be formed of aluminum (Al) or tungsten (W).

The memory device 500 may include at least one upper chip including a cell region. For example, as illustrated in FIG. 17, the memory device 500 may be implemented to include two upper chips. However, this is illustrative, and the number of upper chips is not limited thereto. In the case in which the memory device 500 is implemented to include two upper chips, the memory device 500 may be manufactured by separately manufacturing a first upper chip including a first cell region CELL1, a second upper chip including a second cell region CELL2, and a lower chip including a peripheral circuit region PERI and thereafter connecting the first upper chip, the second upper chip, and the lower chip by a bonding method. The first upper chip may be turned over and connected to the lower chip by the bonding method, and the second upper chip may also be turned over and connected to the first upper chip by the bonding method. In the following description, upper portions and lower portions of the first and second upper chips are defined based on before the first upper chip and the second upper chip are turned over. That is, in FIG. 17, an upper portion of the lower chip refers to an upper portion defined based on a +Z-axis direction, and the upper portions of the first and second upper chips refer to upper portions defined based on a −Z-axis direction. However, this is illustrative, and only one of the first upper chip and the second upper chip may be turned over and connected by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b, and 220c formed on the first substrate 210. An interlayer insulating layer 215 including one or more insulating layers may be provided on the plurality of circuit elements 220a, 220b, and 220c, and a plurality of metal lines connecting the plurality of circuit elements 220a, 220b, and 220c may be provided in the interlayer insulating layer 215. For example, the plurality of metal lines may include first metal lines 230a, 230b, and 230c connected with the plurality of circuit elements 220a, 220b, and 220c, respectively, and second metal lines 240a, 240b, and 240c formed on the first metal lines 230a, 230b, and 230c. The plurality of metal lines may be formed of at least one of various conductive materials. For example, the first metal lines 230a, 230b, and 230c may be formed of tungsten having a relatively high electrical resistivity, and the second metal lines 240a, 240b, and 240c may be formed of copper having a relatively low electrical resistivity.

In this specification, only the first metal lines 230a, 230b, and 230c and the second metal lines 240a, 240b, and 240c are illustrated and described. However, without being limited thereto, one or more additional metal lines may be further formed on the second metal lines 240a, 240b, and 240c. In this case, the second metal lines 240a, 240b, and 240c may be formed of aluminum At least some of the additional metal lines formed on the second metal lines 240a, 240b, and 240c may be formed of copper having a lower electrical resistivity than the aluminum of the second metal lines 240a, 240b, and 240c.

The interlayer insulating layer 115 may be disposed on the first substrate 210 and may include an insulating material, such as silicon oxide or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (the Z-axis direction) perpendicular to an upper surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked in a direction (the Z-axis direction) perpendicular to an upper surface of the third substrate 410.

The second substrate 310 and the third substrate 410 may be formed of various materials and may be, for example, silicon substrates, silicon-germanium substrates, germanium substrates, or substrates having mono-crystalline epitaxial layers grown on mono-crystalline silicon substrates. A plurality of channel structures CH may be formed in the first and second cell regions CELL1 and CELL2.

In an implementation, as illustrated in A1, the channel structure CH may be provided in the bit line bonding region BLBA and may extend in the direction perpendicular to the upper surface of the second substrate 310 to penetrate the word lines 330, the string selection lines, and the ground selection line. The channel structure CH may include a data storage layer, a channel layer, and a buried insulating layer. The channel layer may be electrically connected with a first metal line 350c and a second metal line 360c in the bit line bonding region BLBA. For example, the second metal line 360c may be a bit line and may be connected to the channel structure CH through the first metal line 350c. The bit line 360c may extend in a first direction (a Y-axis direction) parallel to the upper surface of the second substrate 310.

In an implementation, as illustrated in A2, the channel structure CH may include a lower channel LCH and an upper channel UCH connected to each other. For example, the channel structure CH may be formed through a process for the lower channel LCH and a process for the upper channel UCH. The lower channel LCH may extend in the direction perpendicular to the upper surface of the second substrate 310 and may penetrate the common source line 320 and the lower word lines 331 and 332. The lower channel LCH may include a data storage layer, a channel layer, and a buried insulating layer and may be connected with the upper channel UCH. The upper channel UCH may penetrate the upper word lines 333 to 338. The upper channel UCH may include a data storage layer, a channel layer, and a buried insulating layer, and the channel layer of the upper channel UCH may be electrically connected with the first metal line 350c and the second metal line 360c. As the length of a channel is increased, it may be difficult to form a channel having a constant width due to process reasons. The memory device 500 may include a channel having improved width uniformity through the lower channel LCH and the upper channel UCH formed by sequential processes.

In the case in which the channel structure CH includes the lower channel LCH and the upper channel UCH as illustrated in A2, a word line located near the boundary between the lower channel LCH and the upper channel UCH may be a dummy word line. For example, the word line 332 and the word line 333 that form the boundary between the lower channel LCH and the upper channel UCH may be dummy word lines. In this case, data may not be stored in memory cells connected to the dummy word lines. Alternatively, the number of pages corresponding to the memory cells connected to the dummy word lines may be smaller than the number of pages corresponding to memory cells connected to normal word lines. A voltage level applied to the dummy word lines may differ from a voltage level applied to the normal word lines, and thus an influence of a non-uniform channel width between the lower channel LCH and the upper channel UCH on an operation of the memory device may be reduced.

Meanwhile, it is illustrated in A2 that the number of lower word lines 331 and 332 penetrated by the lower channel LCH is smaller than the number of upper word lines 333 to 338 penetrated by the upper channel UCH. However, this is illustrative, and the present disclosure is not limited thereto.

In another example, the number of lower word lines penetrated by the lower channel LCH may be equal to or larger than the number of upper word lines penetrated by the upper channel UCH. Furthermore, the above-described structure and connection relationship of the channel structure CH disposed in the first cell region CELL1 may be identically applied to the channel structure CH disposed in the second cell region CELL2.

In the bit line bonding region BLBA, a first through-electrode THV1 may be provided in the first cell region CELL1, and a second through-electrode THV2 may be provided in the second cell region CELL2. As illustrated in FIG. 17, the first through-electrode THV1 may penetrate the common source line 320 and the plurality of word lines 330. However, this is illustrative, and the first through-electrode THV1 may additionally penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In an implementation, the first through-electrode THV1 and the second through-electrode THV2 may be electrically connected through a first through-metal pattern 372d and a second through-metal pattern 472d. The first through-metal pattern 372d may be formed on a lower side of the first upper chip including the first cell region CELL1, and the second through-metal pattern 472d may be formed on an upper side of the second upper chip including the second cell region CELL2. The first through-electrode THV1 may be electrically connected with the first metal line 350c and the second metal line 360c. A lower VIA 371d may be formed between the first through-electrode THV1 and the first through-metal pattern 372d, and an upper VIA 471d may be formed between the second through-electrode THV2 and the second through-metal pattern 472d. The first through-metal pattern 372d and the second through-metal pattern 472d may be connected by a bonding method.

Furthermore, in the bit line bonding region BLBA, an upper metal pattern 252 may be formed on the uppermost metal layer of the peripheral circuit region PERI, and an upper metal pattern 392 having the same shape as the upper metal pattern 252 may be formed on the uppermost metal layer of the first cell region CELL1. The upper metal pattern 392 of the first cell region CELL1 and the upper metal pattern 252 of the peripheral circuit region PERI may be electrically connected to each other by a bonding method. In the bit line bonding region BLBA, the bit line 360c may be electrically connected with a page buffer included in the peripheral circuit region PERI. For example, some of the circuit elements 220c of the peripheral circuit region PERI may provide a page buffer, and the bit line 360c may be electrically connected with the circuit elements 220c which provide the page buffer through an upper bonding metal 370c of the first cell region CELL1 and an upper bonding metal 270c of the peripheral circuit region PERI.

Continuing to refer to FIG. 17, in the word line bonding region WLBA, the word lines 330 of the first cell region CELL1 may extend in a second direction (an X-axis direction) parallel to the upper surface of the second substrate 310 and may be connected with a plurality of cell contact plugs 340 (341 to 347). A first metal line 350b and a second metal line 360b may be sequentially connected to upper portions of the cell contact plugs 340 connected to the word lines 330. In the word line bonding region WLBA, the cell contact plugs 340 may be connected with the peripheral circuit region PERI through an upper bonding metal 370*b* of the first cell region CELL1 and an upper bonding metal 270*b* of the peripheral circuit region PERI.

The cell contact plugs 340 may be electrically connected with a row decoder included in the peripheral circuit region PERI. For example, some of the circuit elements 220*b* of the peripheral circuit region PERI may provide a row decoder, and the cell contact plugs 340 may be electrically connected with the circuit elements 220*b* which provide the row decoder through the upper bonding metal 370*b* of the first cell region CELL1 and the upper bonding metal 270*b* of the peripheral circuit region PERI. In an implementation, an operating voltage of the circuit elements 220*b* that provide the row decoder may differ from an operating voltage of the circuit elements 220*c* that provide the page buffer. For example, the operating voltage of the circuit elements 220*c* that provide the page buffer may be greater than the operating voltage of the circuit elements 220*b* that provide the row decoder.

Likewise, in the word line bonding region WLBA, the word lines 430 of the second cell region CELL2 may extend in the second direction (the X-axis direction) parallel to the upper surface of the third substrate 410 and may be connected with a plurality of cell contact plugs 440 (441 to 447). The cell contact plugs 440 may be connected with the peripheral circuit region PERI through an upper metal pattern of the second cell region CELL2, a lower metal pattern and an upper metal pattern of the first cell region CELL1, and a cell contact plug 348.

In the word line bonding region WLBA, the upper bonding metal 370*b* may be formed in the first cell region CELL1, and the upper bonding metal 270*b* may be formed in the peripheral circuit region PERI. The upper bonding metal 370*b* of the first cell region CELL1 and the upper bonding metal 270*b* of the peripheral circuit region PERI may be electrically connected to each other by a bonding method. The upper bonding metal 370*b* and the upper bonding metal 270*b* may, for example, be formed of aluminum, copper, or tungsten.

In the external pad bonding region PA, a lower metal pattern 371*e* may be formed on a lower portion of the first cell region CELL1, and an upper metal pattern 472*a* may be formed on an upper portion of the second cell region CELL2. The lower metal pattern 371*e* of the first cell region CELL1 and the upper metal pattern 472*a* of the second cell region CELL2 may be connected by a bonding method in the external pad bonding region PA. Likewise, an upper metal pattern 372*a* may be formed on an upper portion of the first cell region CELL1, and an upper metal pattern 272*a* may be formed on an upper portion of the peripheral circuit region PERI. The upper metal pattern 372*a* of the first cell region CELL1 and the upper metal pattern 272*a* of the peripheral circuit region PERI may be connected to each other by a bonding method.

Common source line contact plugs 380 and 480 may be disposed in the external pad bonding region PA. The common source line contact plugs 380 and 480 may be formed of a conductive material, such as metal, a metal compound, or doped poly-silicon. The common source line contact plug 380 of the first cell region CELL1 may be electrically connected with the common source line 320, and the common source line contact plug 480 of the second cell region CELL2 may be electrically connected with the common source line 420. A first metal line 350*a* and a second metal line 360*a* may be sequentially stacked on an upper portion of the common source line contact plug 380 of the first cell region CELL1, and a first metal line 450*a* and a second metal line 460*a* may be sequentially stacked on an upper portion of the common source line contact plug 480 of the second cell region CELL2.

Input/output pads 205, 405, and 406 may be disposed in the external pad bonding region PA. Referring to FIG. 17, a lower insulating layer 201 may cover a lower surface of the first substrate 210, and the first input/output pad 205 may be formed on the lower insulating layer 201. The first input/output pad 205 may be connected with at least one of the plurality of circuit elements 220*a* disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 and may electrically isolate the first input/output contact plug 203 from the first substrate 210.

An upper insulating layer 401 may be formed on the third substrate 410 to cover the upper surface of the third substrate 410. The second input/output pad 405 and/or the third input/output pad 406 may be disposed on the upper insulating layer 401. The second input/output pad 405 may be connected with at least one of the plurality of circuit elements 220*a* disposed in the peripheral circuit region PERI through second input/output contact plugs 403 and 303, and the third input/output pad 406 may be connected with at least one of the plurality of circuit elements 220*a* disposed in the peripheral circuit region PERI through third input/output contact plugs 404 and 304.

In an implementation, the third substrate 410 may not be disposed in the regions in which the input/output contact plugs are disposed. For example, as illustrated in region B, the third input/output contact plug 404 may be separated from the third substrate 410 in a direction parallel to the upper surface of the third substrate 410, may penetrate an interlayer insulating layer 415 of the second cell region CELL2, and may be connected to the third input/output pad 406. In this case, the third input/output contact plug 404 may be formed through various processes.

For example, as illustrated in B1, the third input/output contact plug 404 may extend in the third direction (the Z-axis direction) and may have an increasing diameter toward the upper insulating layer 401. That is, while the channel structure CH described with reference to A1 has a decreasing diameter toward the upper insulating layer 401, the third input/output contact plug 404 may have an increasing diameter toward the upper insulating layer 401. For example, the third input/output contact plug 404 may be formed after the second cell region CELL2 and the first cell region CELL1 are coupled by a bonding method.

For example, as illustrated in B2, the third input/output contact plug 404 may extend in the third direction (the Z-axis direction) and may have a decreasing diameter toward the upper insulating layer 401. That is, likewise to the channel structure CH, the third input/output contact plug 404 may have a decreasing diameter toward the upper insulating layer 401. For example, the third input/output contact plug 404 may be formed together with the cell contact plugs 440 before the second cell region CELL2 and the first cell region CELL1 are coupled by a bonding method.

In an implementation, an input/output contact plug may be disposed to overlap the third substrate 410. For example, as illustrated in region C, the second input/output contact plug 403 may be formed through the interlayer insulating layer 415 of the second cell region CELL2 in the third direction (the Z-axis direction) and may be electrically connected to the second input/output pad 405 through the third substrate 410. In this case, a connection structure of the second input/output contact plug 403 and the second input/output pad 405 may be implemented in various ways.

For example, as illustrated in C1, an opening 408 may be formed through the third substrate 410, and the second input/output contact plug 403 may be directly connected to the second input/output pad 405 through the opening 408 formed in the third substrate 410. In this case, as illustrated in C1, the second input/output contact plug 403 may have an increasing diameter toward the second input/output pad 405. However, this is illustrative, and the second input/output contact plug 403 may have a decreasing diameter toward the second input/output pad 405.

For example, as illustrated in C2, the opening 408 may be formed through the third substrate 410, and a contact 407 may be formed in the opening 408. One end portion of the contact 407 may be connected to the second input/output pad 405, and an opposite end portion of the contact 407 may be connected to the second input/output contact plug 403. Accordingly, the second input/output contact plug 403 may be electrically connected to the second input/output pad 405 through the contact 407 in the opening 408. In this case, as illustrated in C2, the contact 407 may have an increasing diameter toward the second input/output pad 405, and the second input/output contact plug 403 may have a decreasing diameter toward the second input/output pad 405. For example, the third input/output contact plug 403 may be formed together with the cell contact plugs 440 before the second cell region CELL2 and the first cell region CELL1 are coupled by a bonding method, and the contact 407 may be formed after the second cell region CELL2 and the first cell region CELL1 are coupled by the bonding method.

For example, as illustrated in C3, a stopper 409 may be additionally formed on an upper surface of the opening 408 of the third substrate 410. The stopper 409 may be a metal line formed on the same layer as the common source line 420. However, this is illustrative, and the stopper 409 may be a metal line formed on the same layer as at least one of the word lines 430. The second input/output contact plug 403 may be electrically connected to the second input/output pad 405 through the contact 407 and the stopper 409.

Meanwhile, similarly to the second and third input/output contact plugs 403 and 404 of the second cell region CELL2, the second and third input/output contact plugs 303 and 304 of the first cell region CELL1 may have a decreasing diameter toward the lower metal pattern 371e, or may have an increasing diameter toward the lower metal pattern 371e.

Meanwhile, in some implementations, a slit 411 may be formed in the third substrate 410. For example, the slit 411 may be formed at any position in the external pad bonding region PA. For example, as illustrated in region D, the slit 411 may be located between the second input/output pad 405 and the cell contact plugs 440 when viewed on a plane. However, this is illustrative, and the slit 411 may be formed such that the second input/output pad 405 is located between the slit 411 and the cell contact plugs 440 when viewed on the plane.

For example, as illustrated in D1, the slit 411 may be formed through the third substrate 410. For example, the slit 411 may be used to prevent the third substrate 410 from being finely cracked when the opening 408 is formed. However, this is illustrative, and the slit 411 may be formed to have a depth ranging from about 60% to about 70% of the thickness of the third substrate 410.

For example, as illustrated in D2, a conductive material 412 may be formed in the slit 411. For example, the conductive material 412 may be used to discharge a leakage current generated while circuit elements in the external pad bonding region PA are driven. In this case, the conductive material 412 may be connected to an external ground line.

For example, as illustrated in D3, an insulating material 413 may be formed in the slit 411. For example, the insulating material 413 may be formed to electrically isolate the second input/output pad 405 and the second input/output contact plug 403 disposed in the external pad bonding region PA from the word line bonding region WLBA. An influence of a voltage provided through the second input/output pad 405 on a metal layer disposed on the third substrate 410 in the word line bonding region WLBA may be interrupted by forming the insulating material 413 in the slit 411.

Meanwhile, in some implementations, the first to third input/output pads 205, 405, and 406 may be selectively formed. For example, the memory device 500 may be implemented to include only the first input/output pad 205 disposed on the first substrate 210, only the second input/output pad 405 disposed on the third substrate 410, or only the third input/output pad 406 disposed on the upper insulating layer 401.

Meanwhile, in some implementations, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the peripheral circuit region PERI and the first cell region CELL1 are bonded to each other, and an insulating layer for covering an upper surface of the common source line 320 or a conductive layer for connection may be formed. Similarly, the third substrate 410 of the second cell region CELL2 may be removed before or after the first cell region CELL1 and the second cell region CELL2 are bonded to each other, and the upper insulating layer 401 for covering an upper surface of the common source line 420 or a conductive layer for connection may be formed.

In an implementation, the voltage generating circuit 170, 170-1, or 170-2 may be formed in a peripheral circuit region, and various operating voltages generated by the voltage generating circuit 170, 170-1, or 170-2 may be provided to word lines, bit lines, string selection lines, ground selection lines, common source lines, a substrate, etc.

Figure 18:
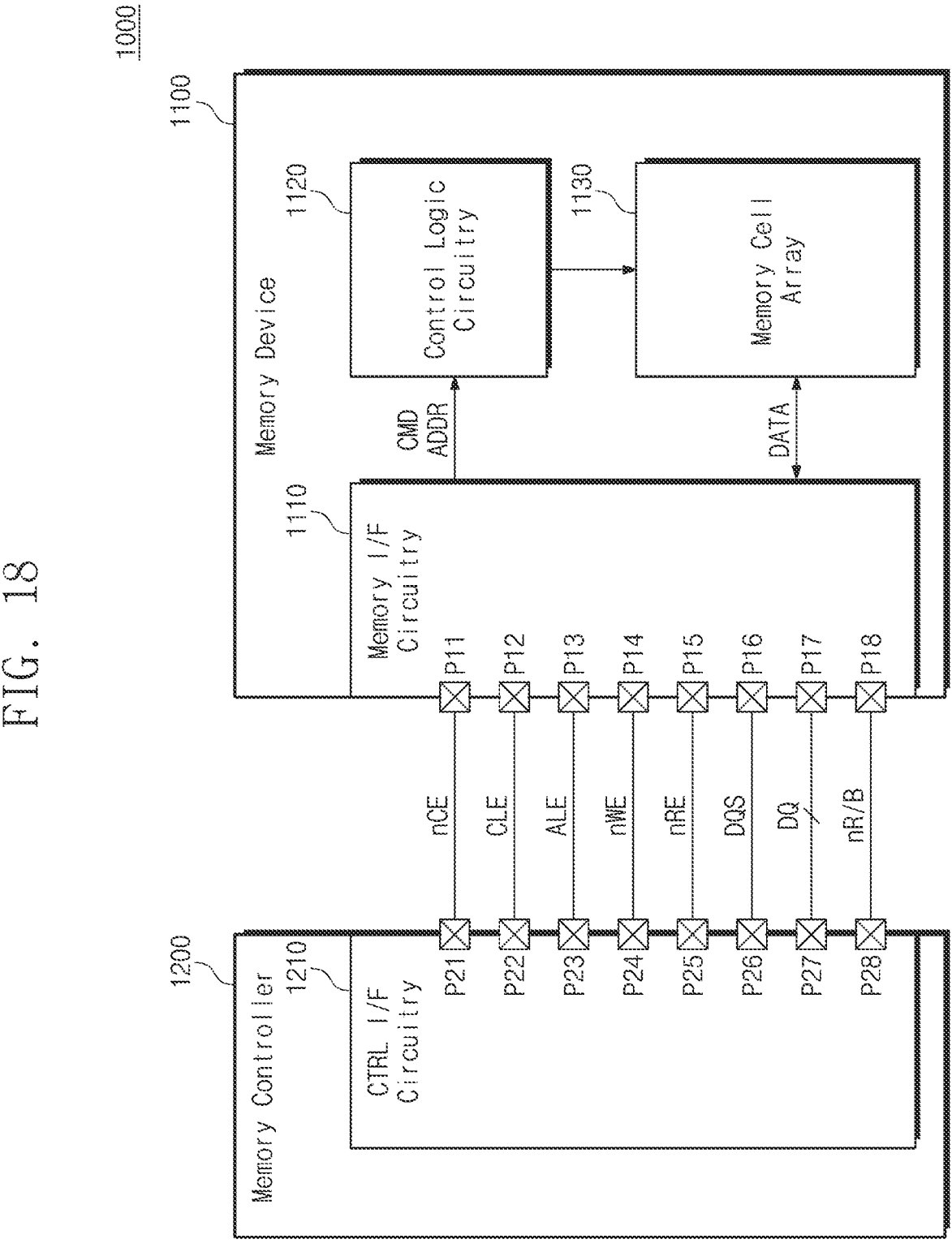
FIG. 18 is a block diagram illustrating an example memory system of the present disclosure.

FIG. 18 is a block diagram of an example memory system 1000. Referring to FIG. 18, the memory system 1000 may include a memory device 1100 and a memory controller 1200.

The memory device 1100 may include first to eighth pins P11 to P18, a memory interface circuitry 1110, a control logic circuitry 1120, and a memory cell array 1130.

The memory interface circuitry 1110 may receive a chip enable signal nCE from the memory controller 1200 through the first pin P11. The memory interface circuitry 1110 may transmit and receive signals to and from the memory controller 1200 through the second to eighth pins P12 to P18 in response to the chip enable signal nCE. For example, when the chip enable signal nCE is in an enable state (e.g., a low level), the memory interface circuitry 1110 may transmit and receive signals to and from the memory controller 1200 through the second to eighth pins P12 to P18.

The memory interface circuitry 1110 may receive a command latch enable signal CLE, an address latch enable signal ALE, and a write enable signal nWE from the memory controller 1200 through the second to fourth pins P12 to P14. The memory interface circuitry 1110 may receive a data signal DQ from the memory controller 1200 through the seventh pin P17 or transmit the data signal DQ to the memory controller 1200. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 1110 may obtain the command CMD from the data signal DQ, which is received in an enable section (e.g., a high-level state) of the command latch enable signal CLE based on toggle time points of the write enable signal nWE. The memory interface circuitry 1110 may obtain the address ADDR from the data signal DQ, which is received in an enable section (e.g., a high-level state) of the address latch enable signal ALE based on the toggle time points of the write enable signal nWE.

In an example implementation, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 1110 may obtain the command CMD or the address ADDR based on toggle time points of the write enable signal nWE.

The memory interface circuitry 1110 may receive a read enable signal nRE from the memory controller 1200 through the fifth pin P15. The memory interface circuitry 1110 may receive a data strobe signal DQS from the memory controller 1200 through the sixth pin P16 or transmit the data strobe signal DQS to the memory controller 1200.

In a data (DATA) output operation of the memory device 1100, the memory interface circuitry 1110 may receive the read enable signal nRE, which toggles through the fifth pin P15, before outputting the data DATA. The memory interface circuitry 1110 may generate the data strobe signal DQS, which toggles based on the toggling of the read enable signal nRE. For example, the memory interface circuitry 1110 may generate a data strobe signal DQS, which starts toggling after a predetermined delay (e.g., tDQSRE), based on a toggling start time of the read enable signal nRE. The memory interface circuitry 1110 may transmit the data signal DQ including the data DATA based on a toggle time point of the data strobe signal DQS. Thus, the data DATA may be aligned with the toggle time point of the data strobe signal DQS and transmitted to the memory controller 1200.

In a data (DATA) input operation of the memory device 1100, when the data signal DQ including the data DATA is received from the memory controller 1200, the memory interface circuitry 1110 may receive the data strobe signal DQS, which toggles, along with the data DATA from the memory controller 1200. The memory interface circuitry 1110 may obtain the data DATA from the data signal DQ based on toggle time points of the data strobe signal DQS. For example, the memory interface circuitry 1110 may sample the data signal DQ at rising and falling edges of the data strobe signal DQS and obtain the data DATA.

The memory interface circuitry 1110 may transmit a ready/busy output signal nR/B to the memory controller 1200 through the eighth pin P18. The memory interface circuitry 1110 may transmit state information of the memory device 1100 through the ready/busy output signal nR/B to the memory controller 1200. When the memory device 1100 is in a busy state (i.e., when operations are being performed in the memory device 1100), the memory interface circuitry 1110 may transmit a ready/busy output signal nR/B indicating the busy state to the memory controller 1200. When the memory device 1100 is in a ready state (i.e., when operations are not performed or completed in the memory device 1100), the memory interface circuitry 1110 may transmit a ready/busy output signal nR/B indicating the ready state to the memory controller 1200. For example, while the memory device 1100 is reading data DATA from the memory cell array 1130 in response to a page read command, the memory interface circuitry 1110 may transmit a ready/busy output signal nR/B indicating a busy state (e.g., a low level) to the memory controller 1200. For example, while the memory device 1100 is programming data DATA to the memory cell array 1130 in response to a program command, the memory interface circuitry 1110 may transmit a ready/busy output signal nR/B indicating the busy state to the memory controller 1200.

The control logic circuitry 1120 may control all operations of the memory device 1100. The control logic circuitry 1120 may receive the command/address CMD/ADDR obtained from the memory interface circuitry 1110. The control logic circuitry 1120 may generate control signals for controlling other components of the memory device 1100 in response to the received command/address CMD/ADDR. For example, the control logic circuitry 1120 may generate various control signals for programming data DATA to the memory cell array 1130 or reading the data DATA from the memory cell array 1130.

The memory cell array 1130 may store the data DATA obtained from the memory interface circuitry 1110, via the control of the control logic circuitry 1120. The memory cell array 1130 may output the stored data DATA to the memory interface circuitry 1110 via the control of the control logic circuitry 1120.

The memory cell array 1130 may include a plurality of memory cells. For example, the plurality of memory cells may be flash memory cells. However, the inventive concept is not limited thereto, and the memory cells may be RRAM cells, FRAM cells, PRAM cells, thyristor RAM (TRAM) cells, or MRAM cells. Hereinafter, an implementation in which the memory cells are NAND flash memory cells will mainly be described.

The memory controller 1200 may include first to eighth pins P21 to P28 and a controller interface circuitry 1210. The first to eighth pins P21 to P28 may respectively correspond to the first to eighth pins P11 to P18 of the memory device 1100.

The controller interface circuitry 1210 may transmit a chip enable signal nCE to the memory device 1100 through the first pin P21. The controller interface circuitry 1210 may transmit and receive signals to and from the memory device 1100, which is selected by the chip enable signal nCE, through the second to eighth pins P22 to P28.

The controller interface circuitry 1210 may transmit the command latch enable signal CLE, the address latch enable signal ALE, and the write enable signal nWE to the memory device 1100 through the second to fourth pins P22 to P24. The controller interface circuitry 1210 may transmit or receive the data signal DQ to and from the memory device 1100 through the seventh pin P27.

The controller interface circuitry 1210 may transmit the data signal DQ including the command CMD or the address ADDR to the memory device 1100 along with the write enable signal nWE, which toggles. The controller interface circuitry 1210 may transmit the data signal DQ including the command CMD to the memory device 1100 by transmitting a command latch enable signal CLE having an enable state. Also, the controller interface circuitry 1210 may transmit the data signal DQ including the address ADDR to the memory device 1100 by transmitting an address latch enable signal ALE having an enable state.

The controller interface circuitry 1210 may transmit the read enable signal nRE to the memory device 1100 through the fifth pin P25. The controller interface circuitry 1210 may receive or transmit the data strobe signal DQS from or to the memory device 1100 through the sixth pin P26.

In a data (DATA) output operation of the memory device 1100, the controller interface circuitry 1210 may generate a read enable signal nRE, which toggles, and transmit the read enable signal nRE to the memory device 1100. For example, before outputting data DATA, the controller interface circuitry 1210 may generate a read enable signal nRE, which is changed from a static state (e.g., a high level or a low level) to a toggling state. Thus, the memory device 1100 may generate a data strobe signal DQS, which toggles, based on the read enable signal nRE. The controller interface circuitry 1210 may receive the data signal DQ including the data DATA along with the data strobe signal DQS, which toggles, from the memory device 1100. The controller interface circuitry 1210 may obtain the data DATA from the data signal DQ based on a toggle time point of the data strobe signal DQS.

In a data (DATA) input operation of the memory device 1100, the controller interface circuitry 1210 may generate a data strobe signal DQS, which toggles. For example, before transmitting data DATA, the controller interface circuitry 1210 may generate a data strobe signal DQS, which is changed from a static state (e.g., a high level or a low level) to a toggling state. The controller interface circuitry 1210 may transmit the data signal DQ including the data DATA to the memory device 1100 based on toggle time points of the data strobe signal DQS.

The controller interface circuitry 1210 may receive a ready/busy output signal nR/B from the memory device 1100 through the eighth pin P28. The controller interface circuitry 1210 may determine state information of the memory device 1100 based on the ready/busy output signal nR/B.

In an implementation, a voltage generating circuit may be included in the memory device of FIG. 18 and may generate various operating voltages based on the method described with reference to FIGS. 1 to 16. The memory device 1100 may operate based on various operating voltages generated by the voltage generating circuit.

Figure 19:
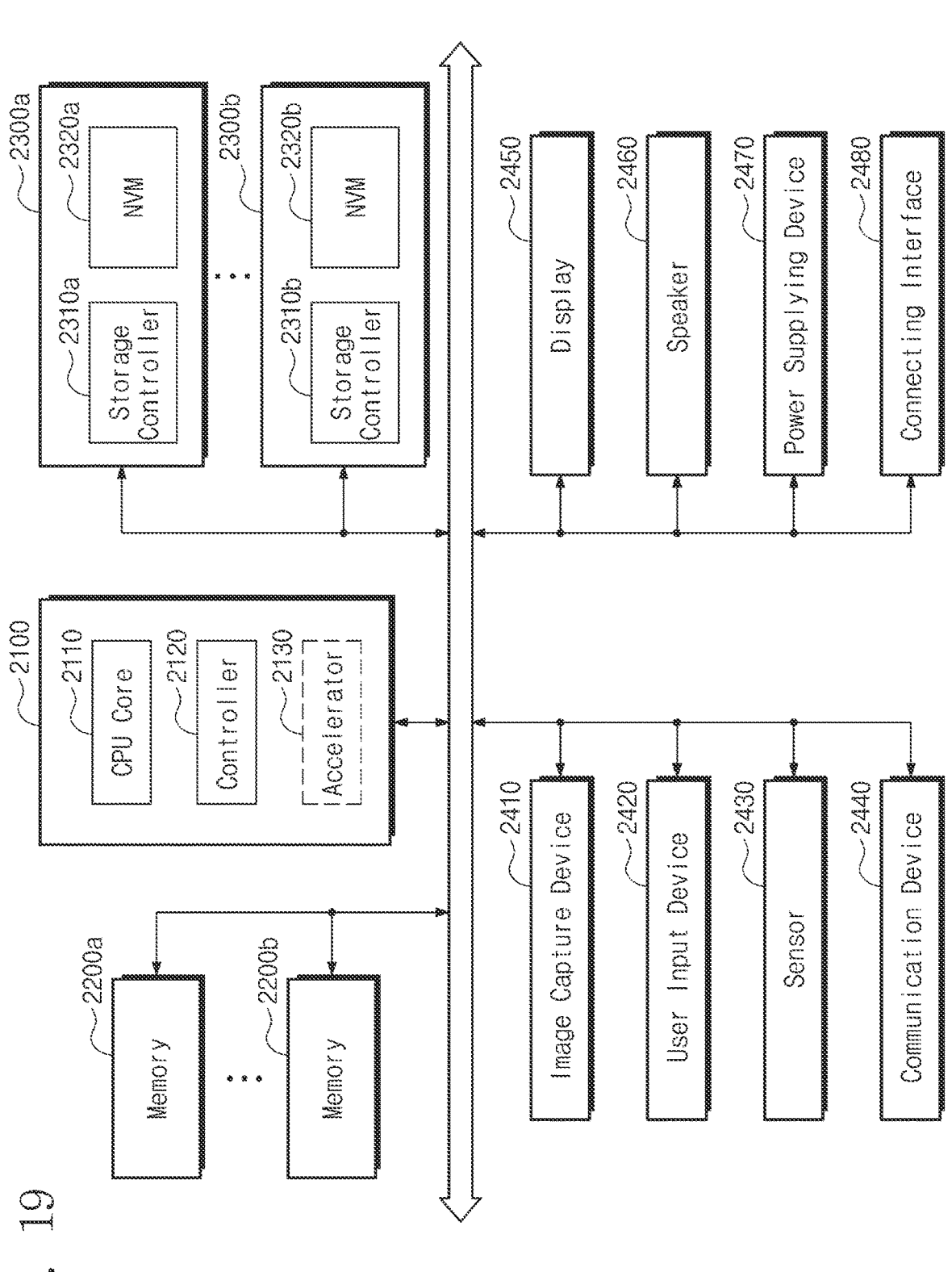
FIG. 19 is a diagram illustrating an example system of the present disclosure.

FIG. 19 is a diagram of an example system 2000 to which a storage device is applied. The system 2000 of FIG. 19 may basically be a mobile system, such as a portable communication terminal (e.g., a mobile phone), a smartphone, a tablet personal computer (PC), a wearable device, a healthcare device, or an Internet of things (IoT) device. However, the system 2000 of FIG. 19 is not necessarily limited to the mobile system and may be a PC, a laptop computer, a server, a media player, or an automotive device (e.g., a navigation device).

Referring to FIG. 19, the system 2000 may include a main processor 2100, memories (e.g., 2200a and 2200b), and storage devices (e.g., 2300a and 2300b). In addition, the system 2000 may include at least one of an image capturing device 2410, a user input device 2420, a sensor 2430, a communication device 2440, a display 2450, a speaker 2460, a power supplying device 2470, and a connecting interface 2480.

The main processor 2100 may control all operations of the system 2000, more specifically, operations of other components included in the system 2000. The main processor 2100 may be implemented as a general-purpose processor, a dedicated processor, or an application processor.

The main processor 2100 may include at least one CPU core 2110 and further include a controller 2120 configured to control the memories 2200a and 2200b and/or the storage devices 2300a and 2300b. In some implementations, the main processor 2100 may further include an accelerator 2130, which is a dedicated circuit for a high-speed data operation, such as an artificial intelligence (AI) data operation. The accelerator 2130 may include a graphics processing unit (GPU), a neural processing unit (NPU) and/or a data processing unit (DPU) and be implemented as a chip that is physically separate from the other components of the main processor 2100.

The memories 2200a and 2200b may be used as main memory devices of the system 1000. Although each of the memories 2200a and 2200b may include a volatile memory, such as static random access memory (SRAM) and/or dynamic RAM (DRAM), each of the memories 2200a and 2200b may include non-volatile memory, such as a flash memory, phase-change RAM (PRAM) and/or resistive RAM (RRAM). The memories 2200a and 2200b may be implemented in the same package as the main processor 2100.

The storage devices 2300a and 2300b may serve as non-volatile storage devices configured to store data regardless of whether power is supplied thereto, and have larger storage capacity than the memories 2200a and 2200b. The storage devices 2300a and 2300b may respectively include storage controllers (STRG CTRL) 2310a and 2310b and NVM (Non-Volatile Memory) 2320a and 2320b configured to store data via the control of the storage controllers 2310a and 2310b. Although the NVMs 2320a and 2320b may include flash memories having a two-dimensional (2D) structure or a three-dimensional (3D) V-NAND structure, the NVMs 2320a and 2320b may include other types of NVMs, such as PRAM and/or RRAM.

The storage devices 2300a and 2300b may be physically separated from the main processor 2100 and included in the system 2000 or implemented in the same package as the main processor 2100. In addition, the storage devices 2300a and 2300b may have types of solid-state devices (SSDs) or memory cards and be removably combined with other components of the system 2000 through an interface, such as the connecting interface 2480 that will be described below. The storage devices 2300a and 2300b may be devices to which a standard protocol, such as a universal flash storage (UFS), an embedded multi-media card (eMMC), or a non-volatile memory express (NVMe), is applied, without being limited thereto.

The image capturing device 2410 may capture still images or moving images. The image capturing device 2410 may include a camera, a camcorder, and/or a webcam.

The user input device 2420 may receive various types of data input by a user of the system 2000 and include a touch pad, a keypad, a keyboard, a mouse, and/or a microphone.

The sensor 2430 may detect various types of physical quantities, which may be obtained from the outside of the system 2000, and convert the detected physical quantities into electric signals. The sensor 2430 may include a temperature sensor, a pressure sensor, an illuminance sensor, a position sensor, an acceleration sensor, a biosensor, and/or a gyroscope sensor.

The communication device 2440 may transmit and receive signals between other devices outside the system 2000 according to various communication protocols. The communication device 2440 may include an antenna, a transceiver, and/or a modem.

The display 2450 and the speaker 2460 may serve as output devices configured to respectively output visual information and auditory information to the user of the system 2000.

The power supplying device 2470 may appropriately convert power supplied from a battery embedded in the system 2000 and/or an external power source, and supply the converted power to each of components of the system 2000.

The connecting interface 2480 may provide connection between the system 2000 and an external device, which is connected to the system 2000 and capable of transmitting and receiving data to and from the system 2000. The connecting interface 2480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

In an implementation, a voltage generating circuit may be included in various components of the system 2000 of FIG. 19 and may generate various operating voltages based on the method described with reference to FIGS. 1 to 16.

According to the present disclosure, a voltage generating circuit may generate various operating voltages by using a common pump block. That is, in generating various operating voltages, because the common pump block is used in common or is shared, the whole area of the voltage generating circuit may decrease. Accordingly, a memory device including the voltage generating circuit with reduced costs and improved performance and an operation method of the memory device are provided.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
a memory cell array including a plurality of memory cells; and
a peripheral circuit configured to perform at least one operation on the memory cell array by using a plurality of operating voltages,
wherein the peripheral circuit includes a voltage generating circuit that includes a first pump block, a second pump block, and a first common pump block, and that is configured to generate the plurality of operating voltages, and
wherein the voltage generating circuit is configured to:
connect the first pump block with the first common pump block in parallel and generate a first operating voltage; and
connect the first common pump block with the second pump block in series and generate a second operating voltage,
wherein the first pump block includes a plurality of first unit pumps, and
wherein the plurality of first unit pumps is connected to each other and has a first serial size and a first parallel size.

2. The memory device of claim 1, wherein a level of the first operating voltage is lower than a level of the second operating voltage.

3. The memory device of claim 1, wherein a load corresponding to the first operating voltage is larger than a load corresponding to the second operating voltage.

4. The memory device of claim 1,
wherein the second pump block includes a plurality of second unit pumps, and
wherein the plurality of second unit pumps is connected to each other and has a second serial size and a second parallel size.

5. The memory device of claim 4, wherein the first common pump block includes a plurality of first common unit pumps, and
wherein the plurality of first common unit pumps is connected to each other and has the first serial size and the second parallel size.

6. The memory device of claim 5, wherein the voltage generating circuit further includes a third pump block and a second common pump block,
wherein the voltage generating circuit is further configured to connect the first common pump block, the second common pump block, and the first pump block in parallel with each other and generate the first operating voltage, and
wherein the voltage generating circuit is further configured to generate a third operating voltage by connecting the first common pump block with the second pump block in series, connecting the second common pump block with the third pump block in series, and connecting an output of the second pump block and an output of the third pump block in parallel with each other.

7. The memory device of claim 6, wherein the third pump block includes a plurality of third unit pumps,
wherein the plurality of third unit pumps is connected to each other and has a third serial size and a third parallel size,
wherein the second common pump block includes a plurality of second common unit pumps, and
wherein the plurality of second common unit pumps is connected to each other and has the first serial size and the third parallel size.

8. The memory device of claim 6, wherein the first operating voltage is a read voltage used in a read operation on the memory cell array,
wherein the second operating voltage is a program voltage used in a program operation on the memory cell array, and
wherein the third operating voltage is an erase voltage used in an erase operation on the memory cell array.

9. The memory device of claim 1, wherein the peripheral circuit further includes a control logic circuit configured to generate a switching signal, and wherein the voltage generating circuit further includes a switch block configured to, based on the switching signal, connect the first common pump block with the first pump block in parallel or to connect the first common pump block with the second pump block in series.

10. The memory device of claim 9, wherein the peripheral circuit further includes a buffer circuit configured to receive a command, an address, and data from an external device through first signal lines, and wherein the control logic circuit is further configured to receive the command from the buffer circuit and to control the switching signal based on the command.

11. A memory device comprising:

a memory cell array including a plurality of memory cells;

a control logic circuit configured to generate a switching signal in response to a command received from an external device; and a voltage generating circuit including a first pump block, a second pump block, and a first common pump block, wherein, in response to the switching signal, the voltage generating circuit is configured to generate a first operating voltage by using the first pump block and the first common pump block and to generate a second operating voltage by using the second pump block and the first common pump block, wherein the first pump block includes a plurality of first unit pumps, and wherein the plurality of first unit pumps is connected to each other and has a first serial size and a first parallel size.

12. The memory device of claim 11, wherein the first operating voltage is a read voltage used in a read operation on the memory cell array, and wherein the second operating voltage is a program voltage used in a program operation on the memory cell array.

13. The memory device of claim 11, wherein a level of the first operating voltage is lower than a level of the second operating voltage, and wherein a load corresponding to the first operating voltage is larger than a load corresponding to the second operating voltage.

14. The memory device of claim 13, wherein the voltage generating circuit is configured to:

connect the first pump block with the first common pump block in parallel and generate the first operating voltage; and connect the first common pump block with the second pump block in series and generate the second operating voltage.

15. The memory device of claim 11, wherein the voltage generating circuit further includes a second common pump block and a third pump block wherein the voltage generating circuit generates the first operating voltage by connecting the first pump block, the first common pump block, and the second common pump block in parallel, and wherein the voltage generating circuit generates a third operating voltage by connecting the first common pump block and the second pump block in series, connecting the second common pump block and the third pump block in series, and connecting an output of the second pump block and an output of the third pump block in parallel.

16. The memory device of claim 15, wherein the third operating voltage is an erase voltage used in an erase operation of the memory cell array.

17. An operation method of a memory device, the method comprising:

receiving an operation command from an external device;

based on the operation command being a read command, performing a read operation based on a read voltage; and based on the operation command being a program command, performing a program operation based on a program voltage, wherein the memory device is configured to:

connect a first pump block, a first common pump block, and a second common pump block in parallel with each other and generate the read voltage; and connect the first common pump block with a second pump block in series and generate the program voltage, wherein the first pump block includes a plurality of first unit pumps, and wherein the plurality of first unit pumps is connected to each other and has a first serial size and a first parallel size.

18. The method of claim 17, further comprising:

based on the operation command being an erase command, performing an erase operation based on an erase voltage, wherein the memory device is configured to generate the erase voltage by connecting the first common pump block with the second pump block in series, connecting the second common pump block with a third pump block in series, and connecting an output of the second pump block with an output of the third pump block in parallel.

19. The method of claim 18, wherein serial sizes of the first pump block, the first common pump block, and the second common pump block are identical to each other.

20. The method of claim 18, wherein parallel sizes of the second pump block and the first common pump block are identical to each other, and parallel sizes of the third pump block and the second common pump block are identical to each other.

* * * * *